US012725649B2

(12) United States Patent
Hu et al.

(10) Patent No.: US 12,725,649 B2
(45) Date of Patent: Sep. 1, 2026

(54) MEMORY DEVICES AND OPERATING METHODS THEREOF, MEMORY SYSTEMS, AND SENSING CIRCUITS

(71) Applicant: Yangtze Memory Technologies Co., Ltd., Wuhan (CN)

(72) Inventors: Chuyan Hu, Wuhan (CN); HuangPeng Zhang, Wuhan (CN); Jinze Song, Wuhan (CN); Xuesong Shen, Wuhan (CN); Debo Wei, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 236 days.

(21) Appl. No.: 18/614,078

(22) Filed: Mar. 22, 2024

(65) Prior Publication Data

US 2025/0174268 A1 May 29, 2025

(30) Foreign Application Priority Data

Nov. 27, 2023 (CN) ......................... 202311607822.1

(51) Int. Cl.

| | |
|---|---|
| ***G11C 7/06*** | (2006.01) |
| ***G11C 11/4076*** | (2006.01) |
| ***G11C 11/4091*** | (2006.01) |
| ***G11C 11/4096*** | (2006.01) |

(52) U.S. Cl.

CPC ...... *G11C 11/4091* (2013.01); *G11C 11/4076* (2013.01); *G11C 11/4096* (2013.01)

(58) Field of Classification Search

CPC ... G11C 11/4091; G11C 5/06; G11C 11/4074; G11C 11/4093; G11C 7/1069; G11C 11/4096; G11C 7/1048; G11C 7/12

See application file for complete search history.

(56) References Cited

U.S. PATENT DOCUMENTS

2005/0146957 A1* 7/2005 Lee .......................... G11C 7/18 365/203
2006/0023535 A1* 2/2006 Chun .................. G11C 11/4094 365/205
2006/0028888 A1* 2/2006 Shin .................... G11C 11/4091 365/205
2006/0221665 A1* 10/2006 Kang .................. G11C 11/4096 365/149
2010/0157702 A1* 6/2010 Seo ...................... G11C 7/1069 365/194
2010/0226192 A1* 9/2010 Moon ................ G11C 11/4096 365/203

(Continued)

*Primary Examiner* — Mushfique Siddique

(74) *Attorney, Agent, or Firm* — Hanley, Flight & Zimmerman, LLC

(57) ABSTRACT

Examples of the present application provide a memory device and operating method thereof, a memory system, and a sensing circuit. Wherein the memory device includes: an array of memory cells; a first sensing circuit coupled to the array of memory cells through a first pair of data lines; a second sensing circuit coupled to the first pair of data lines through a second pair of data lines; an isolation circuit located between the first pair of data lines and the second pair of data lines; a control circuit configured to: in the first sensing phase, control the first sensing circuit to amplify the data signal to the first sensing signal, and control the isolation circuit to connect the first pair of data lines and the second pair of data lines.

20 Claims, 19 Drawing Sheets

(56) References Cited

U.S. PATENT DOCUMENTS

2010/0315893 A1* 12/2010 Hong .................. G11C 7/1078
365/189.11
2011/0103123 A1* 5/2011 Nakaoka ............ G11C 11/4074
365/63
2012/0113734 A1* 5/2012 Yamada ............... G11C 29/025
365/201
2020/0152249 A1* 5/2020 Kawamura ............. G11C 7/12

* cited by examiner

MEMORY DEVICES AND OPERATING METHODS THEREOF, MEMORY SYSTEMS, AND SENSING CIRCUITS

REFERENCE TO RELATED APPLICATION

This application claims priority to and the benefit of Chinese Patent Application 202311607822.1, filed on Nov. 27, 2023, which is hereby incorporated by reference in its entirety.

FIELD OF TECHNOLOGY

Examples of the present application relate to the field of semiconductor technology, and in particular to a memory device and operating method thereof, a memory system, and a sensing circuit.

BACKGROUND

Memory devices and their systems are storage devices used to store information in modern information technology.

DETAILED DESCRIPTION

Figure 1:
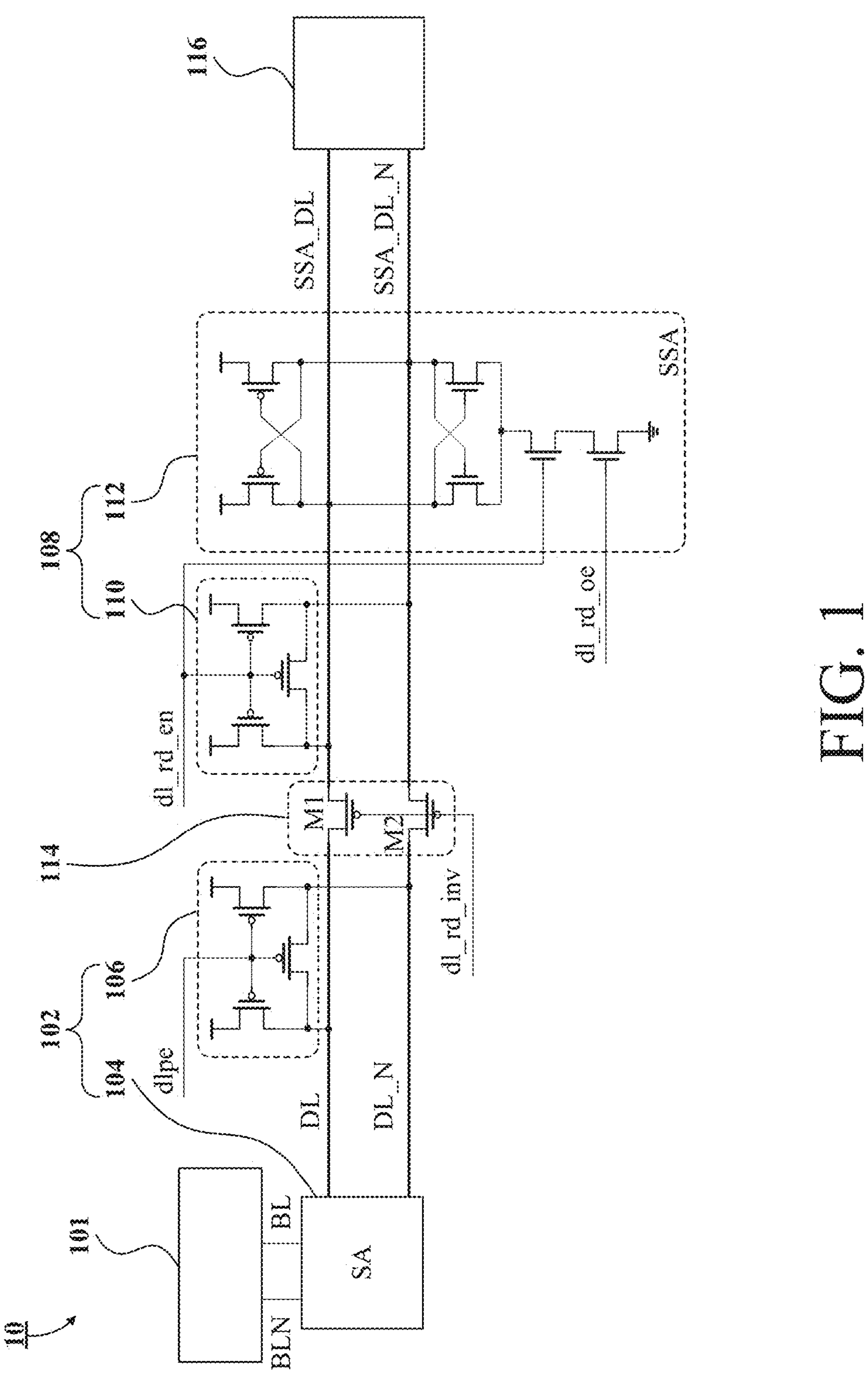
FIG. 1 is a schematic diagram of a memory device with a sensing circuit provided by an example of the present application.
Figure 2:
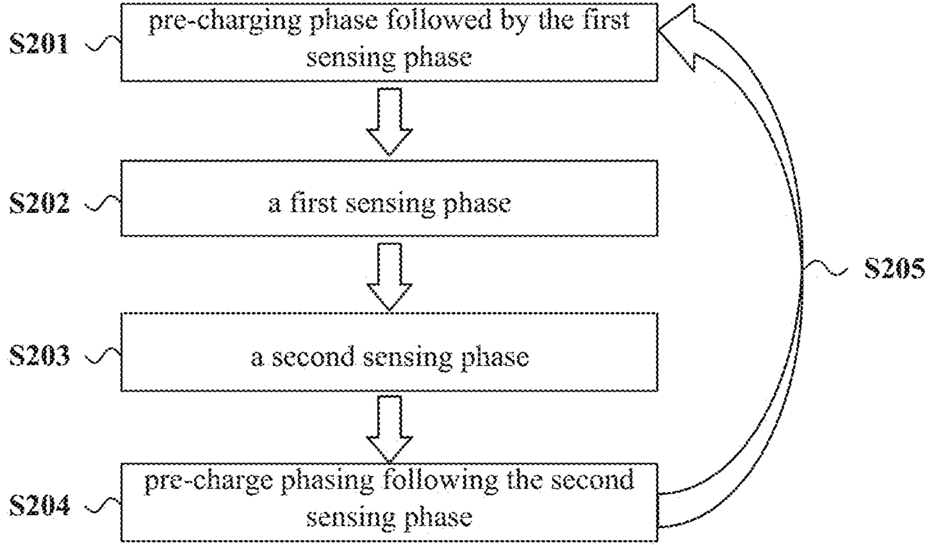
FIG. 2 is a schematic diagram of the process of operating a sensing circuit provided by an example of the present application.

The technical solutions in implementations of the present application will be clearly and completely described below in conjunction with the implementations and accompanying drawings, apparently, the described implementations are only some, not all of implementations of the present application. All other implementations obtained by those skilled in the art based on the implementations in the present application without making creative efforts belong to the claimed scope of the present application.

In the following description, numerous details are given in order to provide a more thorough understanding of the present application. However, it will be apparent to one skilled in the art that the present application may be practiced without one or more of these details. In other examples, in order to avoid confusion with the present application, some technical features known in the art are not described; that is, not all features of the actual example are described here, and well-known functions and structures are not described in detail.

In the accompanying drawings, size of a layer, a region, an element and their relative sizes may be exaggerated for clarity. Like reference numerals refer to like elements throughout.

It will be understood that when an element or layer is referred to as being "on," "adjacent to," "connected to" or "coupled to" another element or layer, it may be directly on, adjacent to, connected to or coupled to another element or layer, or intervening elements or layers may be present. In contrast, when an element is referred to as being "directly on," "directly adjacent to," "directly connected to" or "directly coupled to" another element or layer, there is no intervening elements or layers present. It will be understood that, although the terms first, second, third etc., may be used to describe various elements, components, regions, layers and/or parts, these elements, components, regions, layers and/or parts should not be limited by these terms. These terms are only used to distinguish one element, component, region, layer or part from another element, component, region, layer or part. Thus, a first element, component, region, layer or part discussed below may be termed as a second element, component, region, layer or part without departing from teachings of the present application. Whereas a second element, component, region, layer or part is discussed, it does not indicate that a first element, component, region, layer or part necessarily presents in the present application.

A term used herein is for the purpose of describing a particular example only and is not to be considered as limitation of the present application. As used herein, the singular forms "a", "an" and "said/the" are intended to include the plural forms as well, unless the context clearly dictates otherwise. It should also be understood that the terms "consists of" and/or "comprising", when used in this description, identify the presence of stated features, integers, operations, operations, elements and/or parts, but do not exclude the presence or addition of one or more other features, integers, operations, operations, elements, parts and/or groups. As used herein, the term "and/or" includes any and all combinations of the associated listed items.

In order to thoroughly understand the present application, detailed operations and detailed structures will be provided in the following description, so as to explain the technical solution of the present application. Preferred examples of the present application are described in detail as follows, however, the present application may have other examples other than these detailed descriptions.

As people's requirements for storage devices continue to increase, there is much room for improvement in memory devices and their systems.

Referring to FIG. 1, FIG. 2, FIG. 3 and FIG. 4, an example of the present application provides a memory device 10 including: an array of memory cells 101; a first sensing circuit 102 coupled to an array of memory cells 101 through a first pair of data lines DL/DL_N; a second sensing circuit 108 coupled to the first pair of data lines DL/DL_N through a second pair of data lines SSA_DL/SSA_DL_N; an isolation circuit 114 located between the first pair of data lines DL/DL_N and the second pair of data lines SSA_DL/SSA_DL_N; and a control circuit 301 coupled to each of the first sensing circuit 102, the second sensing circuit 108 and the isolation circuit 114, and configured to perform the following operations: S201. In a pre-charging phase followed by the first sensing phase, pre-charging the first pair of data lines DL/DL_N to a first pre-charge voltage; S202, in a first sensing phase, amplifying a received data signal from the array of memory cells 101 to a first sensing signal through the first sensing circuit 102, i.e., a first voltage difference is generated between the first pair of data lines DL/DL_N; S203, in the second sensing phase, amplifying the received first sensing signal to a second sensing signal through the second sensing circuit 108, i.e., a second voltage difference is generated between the second pair of data lines SSA_DL/SSA_DL_N; wherein, the second voltage difference is greater than the first voltage difference; S204, in the pre-charging phase following the second sensing phase, pre-charging the second pair of data lines SSA_DL/SSA_DL_N to a second pre-charge voltage; S205, performing the above operations S201 to S204 to implement the process of operating the sensing circuit in the next loop.

In an example of the present application, the sense amplifier of the memory device 10 is a multi-stage sense amplifier (including a first sensing circuit and a second sensing circuit) that may accelerate data reading from the first pair of data lines DL/DL_N to the second pair of data lines SSA_DL/SSA_DL_N (which may be understood as a local bank data line (LBDL)) and reduce the overall sense voltage and delay of the memory banks of the memory device 10. Each stage of the multi-stage sense amplifier is required to work collaboratively, which puts forward higher requirements for the matching of control signals and timing, and multi-stage sense amplifier may achieve better performance when its control signals are correctly matched to timing.

The process of operating the sense amplifier may be performed operation by operation, e.g., the pre-charge of the sense amplifier and the sensing of the sense amplifier may be performed operation by operation. In some examples, referring to FIGS. 1 and 2, the following operations may be performed one by one: pre-charging the first pair of data lines DL/DL_N, amplifying a received data signal from the array of memory cells 101 to a first sensing signal through the first sensing circuit 102, amplifying the received first sensing signal to a second sensing signal through the second sensing circuit 108 and pre-charging the second pair of data lines SSA_DL/SSA_DL_N. The control signal of the sense amplifier generated by the control circuit 301 is critical, and the control signal may vary according to conditions, e.g., conditions include process, voltage and temperature conditions, or timing mismatches in the original signal.

Figure 3:
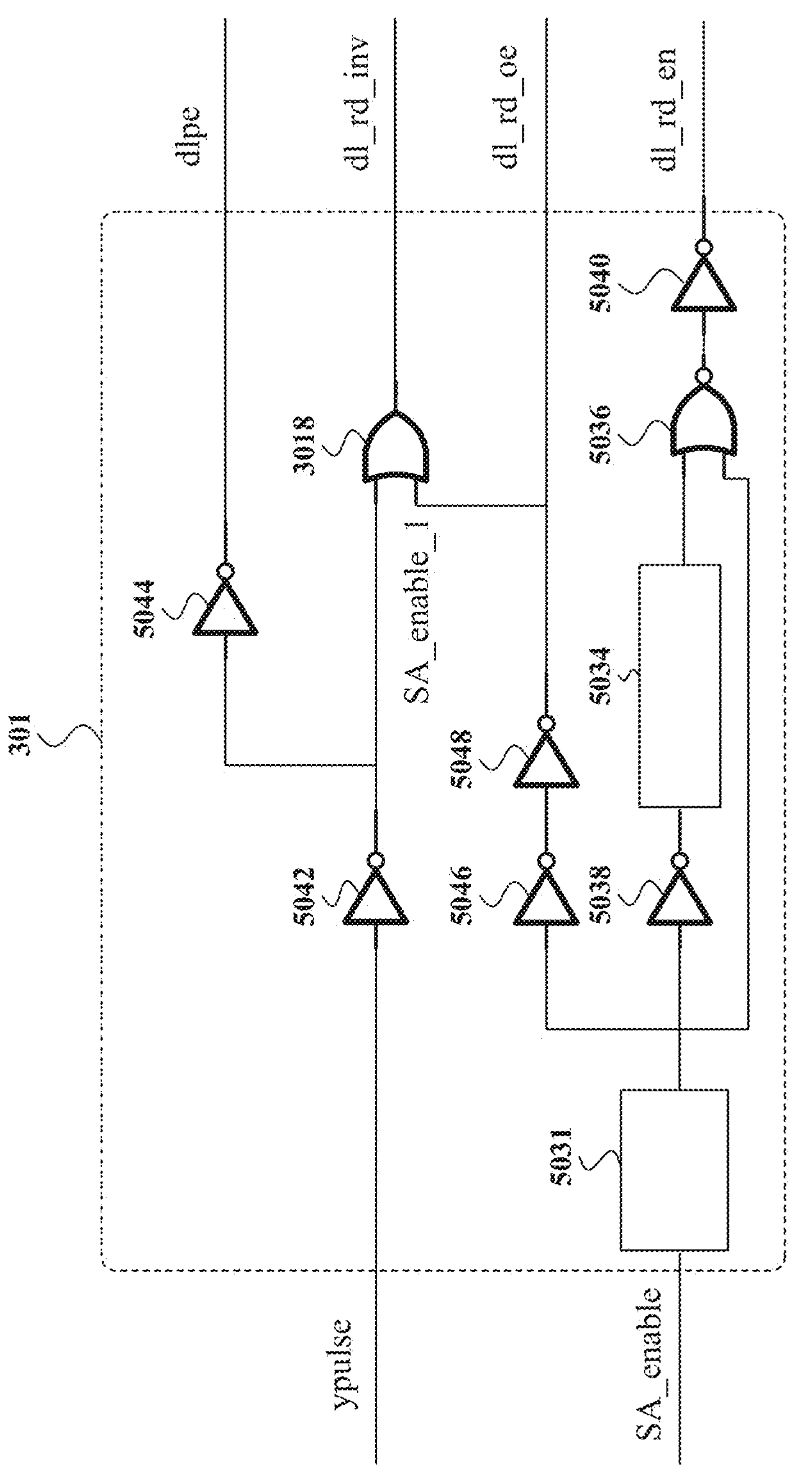
FIG. 3 is a schematic diagram of a control circuit of a first sensing circuit provided by an example of the present application.
Figure 4:
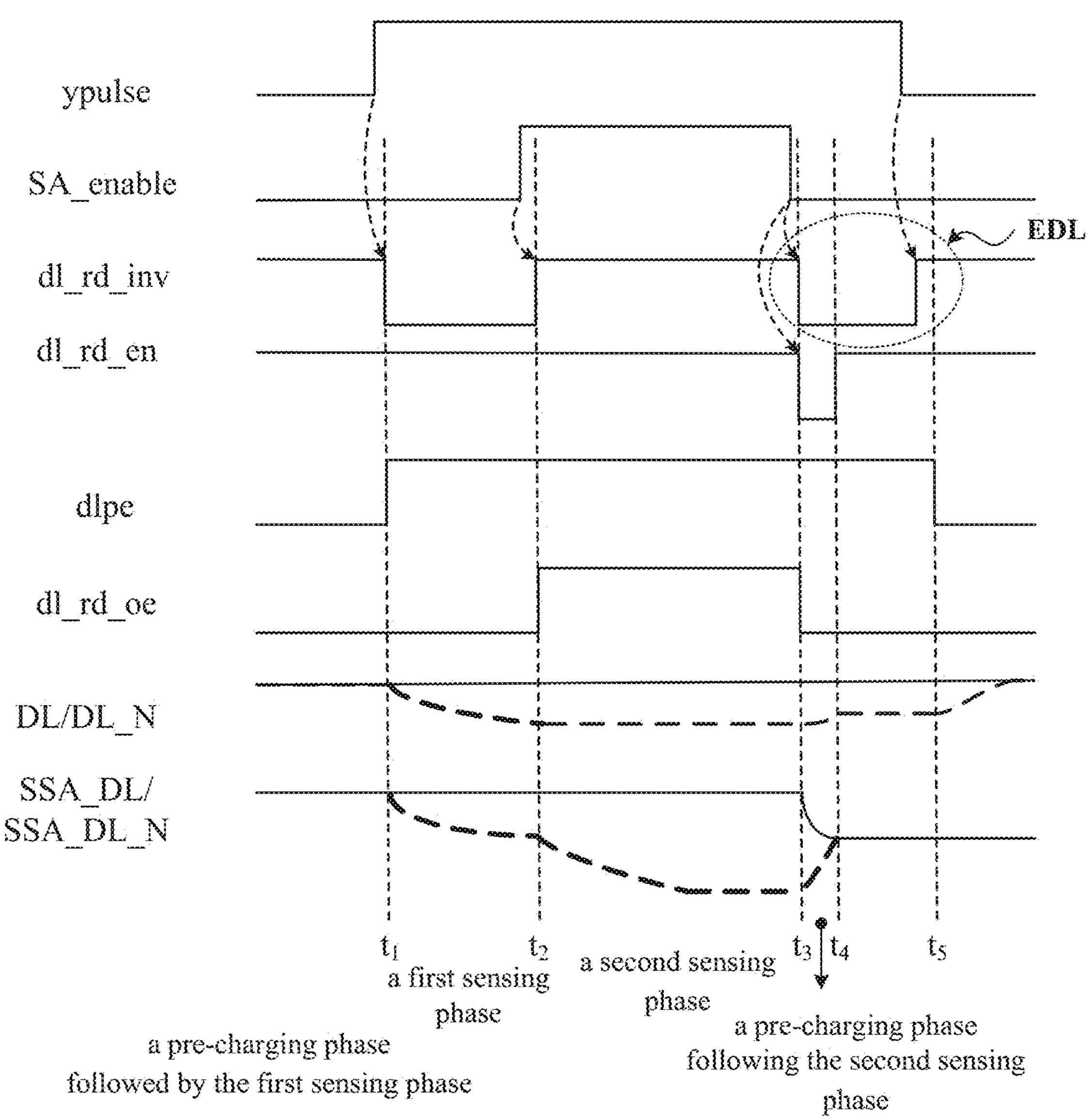
FIG. 4 is a timing diagram of a first control circuit provided by an example of the present application.

Referring to FIGS. 3 and 4, in some examples, the control circuit 301 includes: a first pre-charge signal generating circuit, an isolation signal generating circuit, a second sensing enable signal generating circuit, and a second pre-charge signal generating circuit.

Referring to FIG. 3, the isolation signal generating circuit includes: an OR gate 3018; the first terminal of the OR gate 3018 receives the first pulse signal ypulse after passing through the inverter 5042, the second terminal of the OR gate 3018 receives the delayed signal SA_enable_1 corresponding to the first sensing enable signal SA_enable, and the output terminal of the OR gate 3018 outputs the isolation signal dl_rd_inv.

In some examples, the first power supply voltage of the first sensing circuit is 2*VDD1M (which may be understood as the first voltage difference between the first pair of data lines DL/DL_N for the first sensing signal), the first pre-charge voltage VDD1M of the first sensing circuit is half of the first power supply voltage 2*VDD1M; the second pre-charge source voltage of the second sensing circuit is 2*VDD2H (which may be understood as the second voltage difference between the second pair of data lines SSA_DL/SSA_DL_N for the second sensing signal), the second pre-charge voltage VDD1H of the second sensing circuit is half of the second pre-charge source voltage 2*VDD2H; and both the first pre-charge voltage VDD1M and the first power supply voltage 2*VDD1M are smaller than the second pre-charge voltage VDD2H.

Referring to FIG. 4, in the pre-charging phase following the second sensing phase, due to the timing mismatch of the input signals, the isolation signal dl_rd_inv is still a logic low level (the part shown by the dotted oval EDL in FIG. 4), the first pair of data lines DL/DL_N and the second pair of data lines SSA_DL/SSA_DL_N are connected, and the second pre-charge signal dl_rd_en is enabled for the time period (the time interval between time $t_3$ and time $t_4$), which causes both the first pair of data lines DL/DL_N and the second pair of data lines SSA_DL/SSA_DL_N to be pre-charged. This situation may cause unknown problems, that the sense amplification of the first sensing phase of the first sensing circuit and the pre-charging of the second sensing circuit are performed at the same time, and the first power supply voltage 2*VDD1M of the first sensing circuit is at the medium voltage level, the second pre-charge voltage VDD2H of the second sensing circuit is at the high voltage level, and the first power supply voltage 2*VDD1M is less than the second pre-charge voltage VDD2H, therefore, it is not easy for the second pair of data lines SSA_DL/SSA_DL_N to be pre-charged to the second pre-charge voltage VDD2H, and it is even more difficult for the first power supply voltage 2*VDD1M of the first sensing circuit to be pre-charged than the second pre-charge voltages VDD2H and VDD2H-δ of the second sensing circuit (understood as the voltage of the second pre-charge voltage VDD2H within the allowable error range).

In view of this, examples of the present application provide a memory device and operating method thereof, a memory system, and a sensing circuit, which may optimize the correct matching of the control signal and timing of the sense amplifier, so that the memory device may achieve better performance.

Referring to FIG. 1, FIG. 2, FIG. 5 and FIG. 6, in a first aspect, an example of the present application provides a memory device 10 including: an array of memory cells 101; a first sensing circuit 102 coupled to the array of memory cells 101 through a first pair of data lines DL/DL_N, and configured to amplify a received data signal from the array of memory cells 101 to a first sensing signal; a second sensing circuit 108 coupled to the first pair of data lines DL/DL_N through a second pair of data lines SSA_DL/SSA_DL_N, and configured to amplify the first sensing signal to a second sensing signal; an isolation circuit 114 located between the first pair of data lines DL/DL_N and the second pair of data lines SSA_DL/SSA_DL_N; and a control circuit coupled to each of the first sensing circuit 102, the second sensing circuit 108 and the isolation circuit 114, and configured to: in the first sensing phase, control the first sensing circuit 102 to amplify the data signal to the first sensing signal, and control the isolation circuit 114 to connect the first pair of data lines DL/DL_N and the second pair of data lines SSA_DL/SSA_DL_N to transmit the first sensing signal to the second pair of data lines SSA_DL/SSA_DL_N; in a second sensing phase following the first sensing phase and a pre-charging phase following the second sensing phase, control the isolation circuit 114 to disconnect the first pair of data lines DL/DL_N and the second pair of data lines SSA_DL/SSA_DL_N; and in the second sensing phase, control the second sensing circuit 108 to amplify the first sensing signal to a second sensing signal, and in the pre-charging phase, control the second sensing circuit 108 to charge the second pair of data lines SSA_DL/SSA_DL_N to a pre-charge voltage.

In some examples, the memory device 10 includes Dynamic Random-Access Memory (DRAM), Synchronous Dynamic Random-Access Memory (SDRAM) or Double-Data-Rate Fourth Generation Synchronous Dynamic Random Access Memory (DDR4 SDRAM). In some examples, the memory device 10 may also include Static Random-Access Memory (SRAM).

In the example of the present application, a pre-charging phase followed by the first sensing phase is in the time interval before time $t_1$; the first sensing phase is in the time interval between time $t_1$ and $t_2$; the second sensing phase is in the time interval between time $t_2$ and $t_3$; the pre-charging phase following the second sensing phase is in the time interval between time $t_3$ and $t_5$; a pre-charging phase followed by the first sensing phase of the next loop is in the time interval after time $t_5$, or a pre-charging phase followed by the first sensing phase starts to loop in the time interval after time $t_5$. In some examples, the pre-charging phase following the second sensing phase includes a second sensing circuit pre-charging phase and a second sensing circuit pre-charge completion phase. The second sensing circuit pre-charging phase is the time interval between time $t_3$ and $t_4$, which is used to represent the time interval from the start time to the completion time of the pre-charge in the second sensing phase; the pre-charge completion phase of the second sensing circuit is the time interval between time $t_4$ and $t_5$, which is used to represent there is a certain time interval between the start time of a pre-charging phase followed by the first sensing phase and the completion time of the pre-charging phase of the second sensing circuit.

In an example of the present application, the logic state of the signal may be represented as logic state "0" and logic state "1". Logic state "0" and logic state "1" are represented as logic low level and logic high level respectively, or, as logic high level and logic low level respectively. Here and below, the logic state "0" and the logic state "1" are represented as a logic low level and a logic high level respectively as an example.

In examples of the present application, during the process of operating the multi-stage sense amplifier (including the first sensing circuit and the second sensing circuit), by improving the timing of the control signal, in the pre-charging phase following the second sensing phases, the isolation circuit 114 is controlled to disconnect the first pair of data lines DL/DL_N and the second pair of data lines SSA_DL/SSA_DL_N, that is to say, in the pre-charging phase following the second sensing phase, the first pair of data lines DL/DL_N is isolated from the second pair of data lines SSA_DL/SSA_DL_N by the isolation circuit 114, thereby eliminating the problem of difficult to pre-charge to the expected intermediate voltage level due to the connection between the first pair of data lines DL/DL_N and the second pair of data lines SSA_DL/SSA_DL_N in the pre-charging phase following the second sensing phase, thus making the performance of the memory device more stable.

Referring to FIG. 1, FIG. 2, FIG. 5 and FIG. 6, in some examples, the control circuit 501 is further configured to: in a pre-charging phase followed by the first sensing phase, control the isolation circuit 114 to disconnect the first pair of data lines DL/DL_N and the second pair of data lines SSA_DL/SSA_DL_N, and control the first sensing circuit 102 to charge the first pair of data lines DL/DL_N to the pre-charge voltage.

Thus, in the first sensing phase, the isolation circuit 114 is controlled to connect the first pair of data lines DL/DL_N and the second pair of data lines SSA_DL/SSA_DL_N, and in a pre-charging phase followed by the first sensing phase, the second sensing phase and the pre-charging phase after the first sensing phase, the isolation circuit 114 is controlled to disconnect the first pair of data lines DL/DL_N and the second pair of data lines SSA_DL/SSA_DL_N.

In some examples, S201, in a pre-charging phase followed by the first sensing phase, the isolation circuit 114 is controlled to disconnect the first pair of data lines DL/DL_N and the second pair of data lines SSA_DL/SSA_DL_N, and the first sensing circuit 102 is controlled to charge the first pair of data lines DL/DL_N to the pre-charge voltage; S203, in the first sensing phase, the isolation circuit 114 is controlled to connect the first pair of data lines DL/DL_N and the second pair of data lines SSA_DL/SSA_DL_N to transmit the first sensing signal on the first pair of data lines DL/DL_N to the second pair of data lines SSA_DL/SSA_DL_N; S203, in the second sensing phase, the isolation circuit 114 is controlled to disconnect the first pair of data lines DL/DL_N and the second pair of data lines SSA_DL/SSA_DL_N, and the second sensing circuit 108 which is to amplify the first sensing signal on the second pair of data lines SSA_DL/SSA_DL_N is controlled to the second sensing signal; S204. In the pre-charging phase following the second sensing phase, the isolation circuit 114 is controlled to disconnect the first pair of data lines DL/DL_N and the second pair of data lines SSA_DL/SSA_DL_N, and the second sensing circuit 108 is controlled to charge the second pair of data lines DL/DL_N to the pre-charge voltage.

Figure 6:
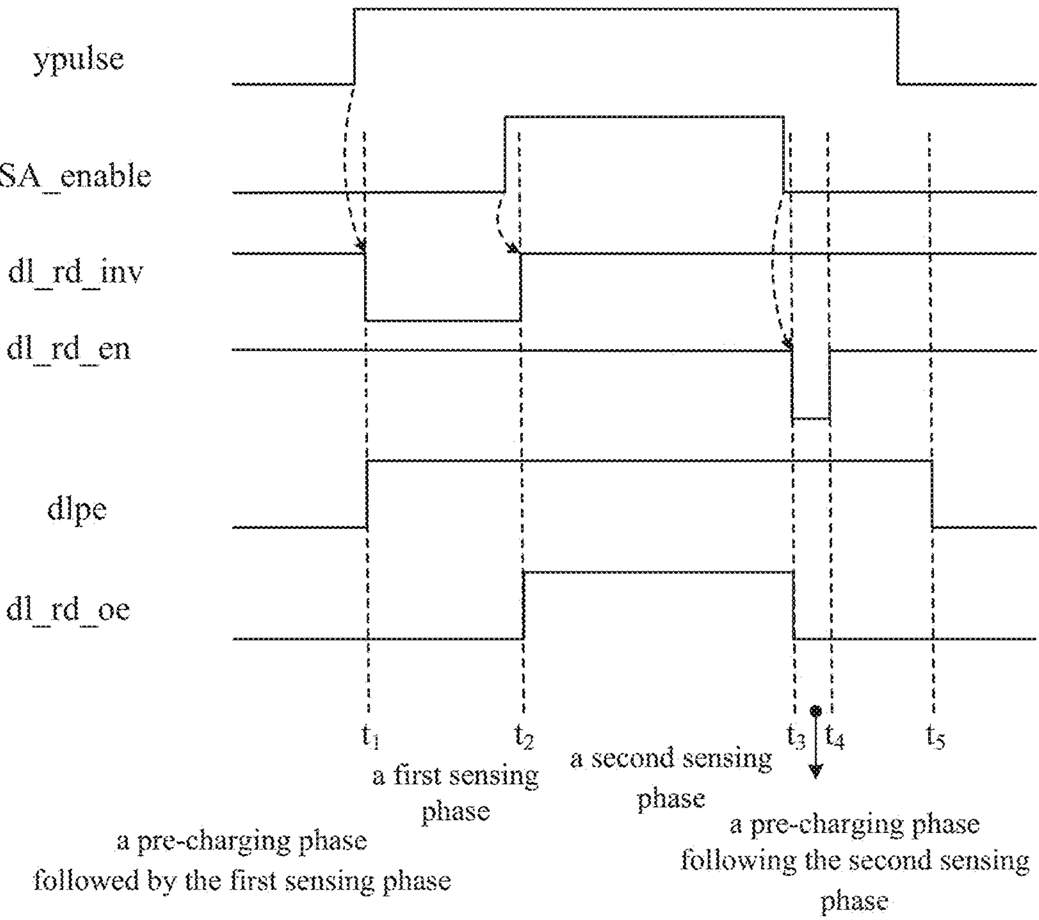
FIG. 6 is a timing diagram of a second control circuit provided by an example of the present application.

It should be noted that the falling edge of the isolation signal dl_rd_inv and the rising edge of the first pulse signal ypulse, the rising edge of the isolation signal dl_rd_inv and the rising edge of the first sensing enable signal SA_enable as well as the falling edge of the first sensing enable signal SA_enable and the falling edge of the second pre-charge signal dl_rd_en shown in FIGS. 4 and 6 are not completely aligned, but there is a delay caused by the device itself.

In examples of the present application, during the process of operating the multi-stage sense amplifier (including the first sensing circuit and the second sensing circuit), by improving the timing of the control signal, only in the first sensing phase, the isolation circuit 114 is controlled to connect the first pair of data lines DL/DL_N and the second pair of data lines SSA_DL/SSA_DL_N, and in a pre-charging phase followed by the first sensing phase, and in the second sensing phase and in the pre-charging phase following the second sensing phase, the first pair of data lines DL/DL_N is isolated from the second pair of data lines SSA_DL/SSA_DL_N by the isolation circuit 114, thereby eliminating the problem of difficult to pre-charge to the expected intermediate voltage level due to the connection between the first pair of data lines DL/DL_N and the second pair of data lines SSA_DL/SSA_DL_N in the pre-charging phase following the second sensing phase, thus making the performance of the memory device more stable.

Figure 7:
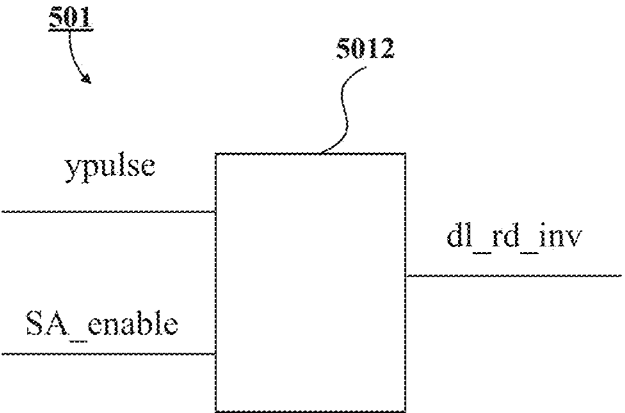
FIG. 7 is a schematic diagram of an isolation signal generating circuit provided by an example of the present application.

Referring to FIG. 7, in some examples, the control circuit 501 includes an isolation signal generating circuit 5012 configured to: receive the first pulse signal ypulse and the first sensing enable signal SA_enable, and output the isolation signal dl_rd_inv in accordance with the first pulse signal ypulse and the first sensing enable signal Sa_enable; and the isolation circuit 114 is configured to: receive the isolation signal dl_rd_inv, and connect or disconnect the first pair of data lines DL/DL_N and the second pair of data lines SSA_DL/SSA_DL_N based on the isolation signal dl_rd_inv.

In some examples, the first pulse signal ypulse is used to connect or disconnect the first pair of sensing output lines and the pair of bit lines BL/BLN of the array of memory cells. In some examples, the first pulse signal ypulse in the first logic state is used to connect the first pair of sensing output lines and the bit line BL/BLN pair of the array of memory cells, and the data signal from the array of memory cells may be transmitted to the first sensing circuit via the pair of bit lines BL/BLN; the first pulse signal ypulse in the second logic state is used to disconnect the first pair of sensing output lines and the bit line BL/BLN pair of the array of memory cells, and the data signal from the array of memory cells may not be transmitted to the first sensing circuit via the pair of bit lines BL/BLN.

In some examples, the first sensing enable signal SA_enable is used to enable or disable the second sensing circuit. In some examples, the first sensing enable signal SA_enable in the first logic state is used to enable the second sensing circuit, and activate the second sensing circuit to amplify the received first sensing signal to the second sensing signal; and the first sensing enable signal SA_enable in the second logic state is used to disable the second sensing circuit and not activate the second sensing circuit.

In some examples, the isolation signal dl_rd_inv generated by the rising edge of the first pulse signal ypulse is in a logic low state and used to connect the first pair of data lines DL/DL_N and the second pair of data lines SSA_DL/SSA_DL_N, the isolation signal dl_rd_inv generated by the rising edge of the first sensing enable signal SA_enable is in a logic high state and used to disconnect the first pair of data lines DL/DL_N and the second pair of data lines SSA_DL/SSA_DL_N.

Thus, in the time interval between time $t_1$ and $t_2$, and in the time interval between the rising edge of the first pulse signal ypulse and the rising edge of the first sensing enable signal SA_enable, the isolation signal dl_rd_inv is in a logic low state and used to connect the first pair of data lines DL/DL_N and the second pair of data lines SSA_DL/SSA_DL_N; in the time interval outside the rising edge of the first pulse signal ypulse and outside the rising edge of the first sensing enable signal SA_enable, the isolation signal dl_rd_inv is in a logic high state and used to disconnect the first pair of data lines DL/DL_N and the second pair of data lines SSA_DL/SSA_DL_N.

Figure 8:
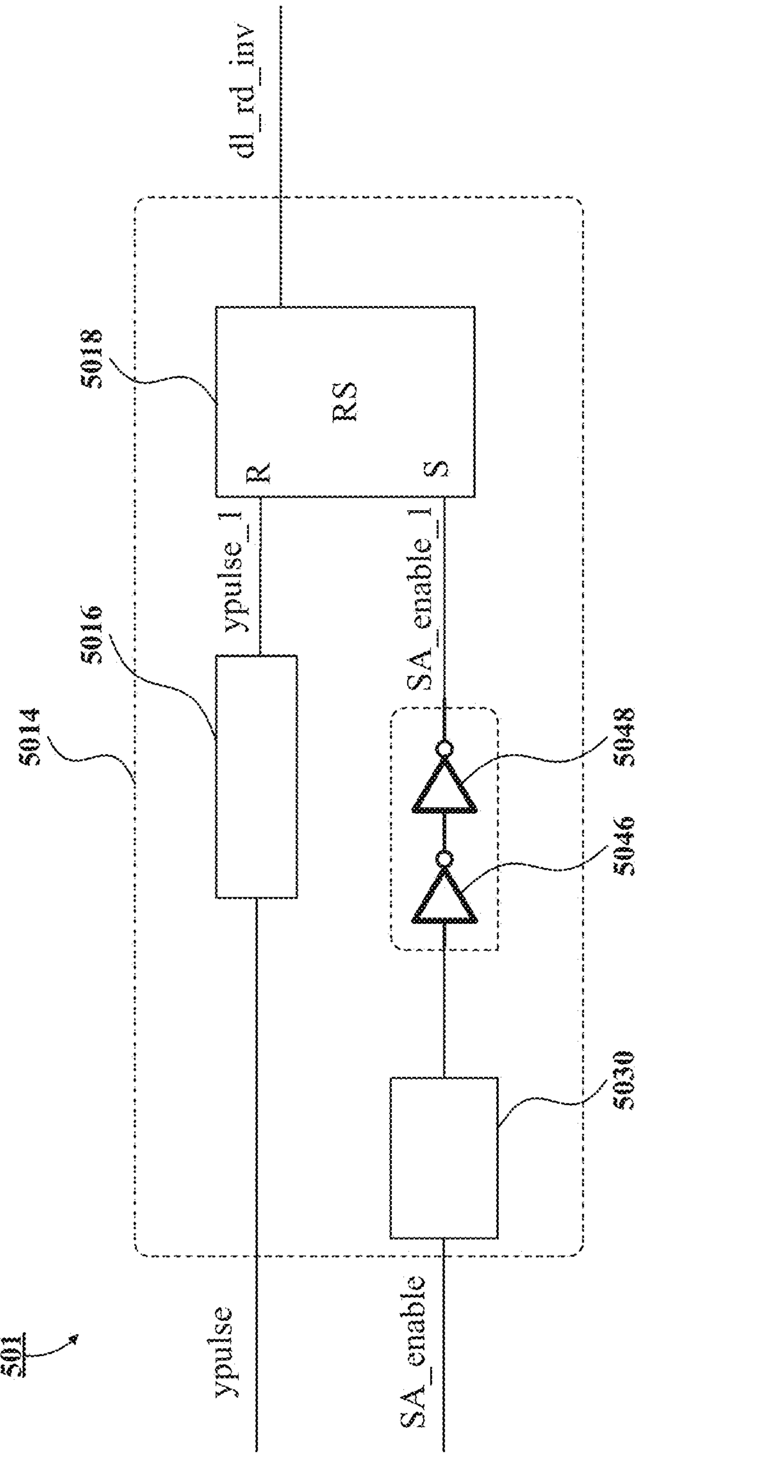
FIG. 8 is a schematic diagram of a pulse elimination circuit provided by an example of the present application.

Referring to FIG. 8, in some examples, the isolation signal generating circuit includes: a pulse elimination circuit 5014; the pulse elimination circuit 5014 is configured to, start to output the isolation signal dl_rd_inv in the first logic state, in response to the first pulse signal ypulse being switched to the deactivated state; output the isolation signal dl_rd_inv switched from the first logic state to the second logic state, in response to the first sensing enable signal SA_enable being switched to the enabled state; the isolation circuit 114 is configured to connect the first pair of data lines DL/DL_N and the second pair of data lines SSA_DL/SSA_DL_N, in response to the isolation signal dl_rd_inv being in the first logic state, or disconnect the first pair of data lines DL/DL_N and the second pair of data lines SSA_DL/SSA_DL_N, in response to the isolation signal dl_rd_inv being in the second logic state.

Here, the first logic state represents logic state "0", i.e., logic low level, and the second logic state represents logic state "1", i.e., logic high level; the activated state/deactivated state of the first pulse signal ypulse is represented by logic state "0"/logic state "1" respectively; the enabled state/non-enabled state of the first sensing enable signal SA_enable is represented by logic state "1"/logic state "0" respectively.

In some examples, the pulse elimination circuit 5014 is configured to, start to output the isolation signal dl_rd_inv in the logic state "0" (the first logic state), in response to the first pulse signal ypulse being switched from the logic state "0" to the logic state "1" (deactivated state); output the isolation signal dl_rd_inv switched from logic state "0" to logic state "1", in response to the first sensing enable signal SA_enable being switched from logic state "0" to logic state "1" (enabled state); the isolation circuit 114 is configured to connect the first pair of data lines DL/DL_N and the second pair of data lines SSA_DL/SSA_DL_N, in response to the isolation signal dl_rd_inv being in the logic state "0", or disconnect the first pair of data lines DL/DL_N and the second pair of data lines SSA_DL/SSA_DL_N, in response to the isolation signal dl_rd_inv being in the logic state "1".

Referring to FIG. 8, in some examples, the pulse maycellation circuit 5014 includes: a pulse generating circuit 5016 and a RS latch 5018; an input terminal of the pulse generating circuit 5016 receives the first pulse signal ypulse, and an output terminal outputs a second pulse signal ypulse_1; when the first pulse signal ypulse is switched to a deactivated state, the second pulse signal ypulse_1 is in the second logic state; the reset terminal R of the RS latch 5016 receives the second pulse signal ypulse_1, the set terminal S receives the delayed signal SA_enable_1 corresponding to the first sensing enable signal SA_enable, and the output terminal outputs the isolation signal dl_rd_inv.

Figure 12:
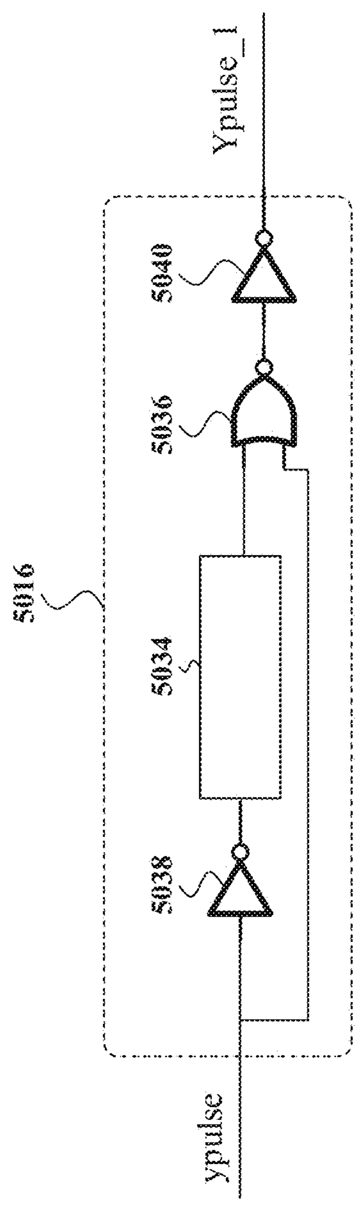
FIG. 12 is a schematic diagram of a pulse generating circuit provided by an example of the present application.

In some examples, referring to FIG. 12, the pulse generating circuit 5016 includes a third inverter 5038, a third delay circuit 5034, a NOR gate 5036, and a fourth inverter 5040; the input terminal of the third inverter 5038 receives the first sensing enable signal SA_enable, the output terminal of the third inverter 5038 is connected to the input terminal of the third delay circuit 5034, the first input terminal of the NOR gate 5036 is connected to the output terminal of the third delay circuit 5034, the second input terminal of the NOR gate 5036 receives the first sensing enable signal Sa_enable, the output terminal of the NOR gate 5036 is connected to the input terminal of the fourth inverter 5040, and the output terminal of the fourth inverter 5040 outputs the second pre-charge signal dl_rd_en.

In some examples, the pulse generating circuit 5016 generates the second pulse signal ypulse_1 on the rising edge of the first pulse signal ypulse, and the second pulse signal ypulse_1 is in a logic high state; and for RS latch 5018, when the second pulse signal ypulse_1 is at a logic high level, the isolation signal dl_rd_inv output by its output terminal is in a logic low level state, and when the first sensing enable signal SA_enable corresponding delay signal SA_enable_1 is at a logic high level level, the isolation signal dl_rd_inv output by its output terminal is in a logic high level state.

Thus, in the time interval between time $t_1$ and $t_2$, and in the time interval between the rising edge of the first pulse signal ypulse and the rising edge of the first sensing enable signal SA_enable, the isolation signal dl_rd_inv is in a logic low state and used to connect the first pair of data lines DL/DL_N and the second pair of data lines SSA_DL/SSA_DL_N; in the time interval outside the rising edge of the first pulse signal ypulse and outside the rising edge of the first sensing enable signal SA_enable, the isolation signal dl_rd_inv is in a logic high state and used to disconnect the first pair of data lines DL/DL_N and the second pair of data lines SSA_DL/SSA_DL_N.

Compared with the isolation signal generating circuit shown in FIG. 3, in an example of the present application, several additional logic gates need to be added to implement the control logic of the sense amplifier, and the cost of the additional several logic gates is not significant. Regardless of the timing mismatch between the first pulse signal ypulse and the first sensing enable signal SA_enable, the isolation circuit 114 is only open in the time interval between time $t_1$ and $t_2$, i.e., the time interval between the rising edge of the first pulse signal ypulse and the rising edge of the first sensing enable signal SA_enable, to connect the first pair of data lines DL/DL_N and the second pair of data lines SSA_DL/SSA_DL_N.

Figure 9:
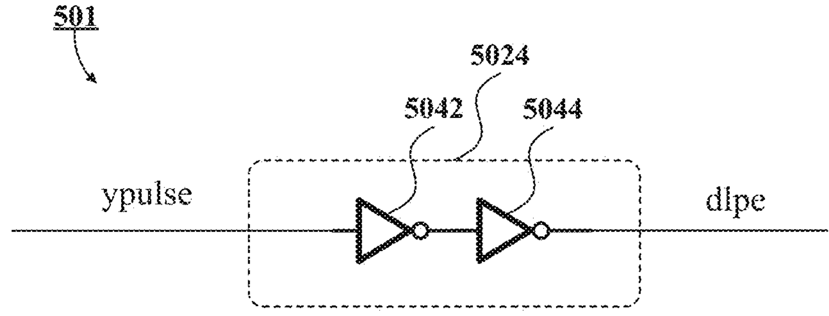
FIG. 9 is a schematic diagram of a first pre-charge signal generating circuit provided by an example of the present application.
Figure 10:
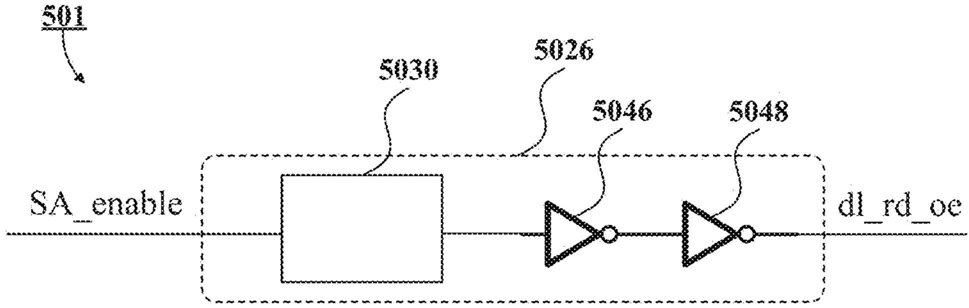
FIG. 10 is a schematic diagram of a second pre-charge signal generating circuit provided by an example of the present application.
Figure 11:
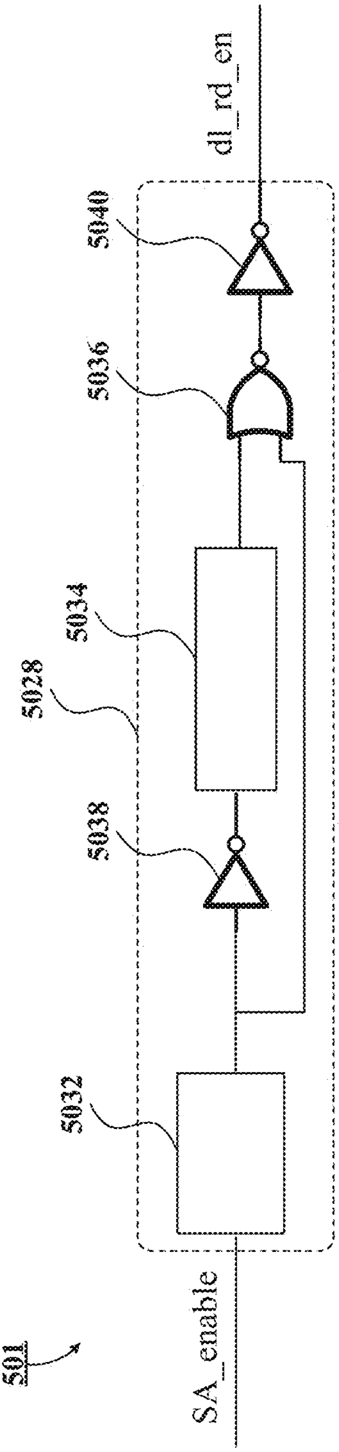
FIG. 11 is a schematic diagram of a second sensing enable signal generating circuit provided by an example of the present application.

Referring to FIGS. 9, 10, and 11, in some examples, the control circuit 501 further includes: a first pre-charge signal generating circuit 5024, a second pre-charge signal generating circuit 5026, and a second sensing enable signal generating circuit 5028; the first pre-charge signal generating circuit 5024 is configured to generate a first pre-charge signal dlpe in accordance with the first pulse signal ypulse; the second pre-charge signal generating circuit 5026 is configured to generate a second pre-charge signal dl_rd_en in accordance with the first sensing enable signal SA_enable; the second sensing enable signal generating circuit 5028 is configured to generate a second sensing enable signal dl_rd_oe in accordance with the first sensing enable signal SA_enable; the first sensing circuit 102 includes: a first sense amplifier 104 and a first pre-charge circuit 106; the second sensing circuit 108 includes: a second sense amplifier 112 and a second pre-charge circuit 110; in a pre-charging phase followed by the first sensing phase, the first pre-charge circuit 106 is configured to: receive the first pre-charge signal dlpe, and in response to the first pre-charge signal dlpe being in an activated state, charge the first pair of data lines DL/DL_N to the pre-charge voltage; in the first sensing phase, the first sense amplifier 104 is configured to amplify the data signal to the first sensing signal after the charge of the first pair of data lines DL/DL_N is completed; in the second sensing phase, the second sense amplifier 112 is configured to receive the second sensing enable signal dl_rd_oe, and in response to the second sensing enable signal dl_rd_oe being in an enabled state, amplify the first sensing signal to the second sensing signal; in a pre-charging phase following the second sensing phase, the second pre-charge circuit 110 is configured to charge the second pair of data lines to the pre-charge voltage, in response to the second pre-charge signal dl_rd_en being in an activated state.

Referring to FIG. 9, FIG. 10 and FIG. 11, in some examples, the first pre-charge signal generating circuit 5024 includes: two first inverters 5042, 5044 connected in series; the input terminals of the two inverters 5042, 5044 connected in series receive the first pulse signal ypulse, and output terminals output the first pre-charge signal dlpe; the second sensing enable signal generating circuit 5026 includes: a first delay circuit and two second inverters 5046, 5048 connected in series; the input terminal of the first delay circuit 5030 receives the first sensing enable signal SA_enable, and the output terminal is connected to the input terminals of the two second inverters 5046, 5048 connected in series, the output terminals of the two second inverters 5046, 5048 connected in series output the second sensing enable signal dl_rd_oc; the second pre-charge signal generating circuit 5028 includes: a second delay circuit 5032, a third delay circuit 5034, a NOR gate 5036, a third inverter 5038 and a fourth inverter 5040; the input terminal of the second delay circuit 5032 receives the first sensing enable signal, and the output terminal is connected to the input terminal of the third inverter 5038, the output terminal of the third inverter 5038 is connected to the input terminal of the third delay circuit 5034, and the first input terminal of the NOR gate 5036 is connected to the output terminal of the third delay circuit 5034, the second input terminal of the NOR gate 5036 is connected to the output terminal of the second delay circuit 5032, the output terminal of the NOR gate 5036 is connected to the input terminal of the fourth inverter 5040, and the output terminal of the fourth inverter 5040 outputs the second pre-charge signal dl_rd_en.

Figure 13:
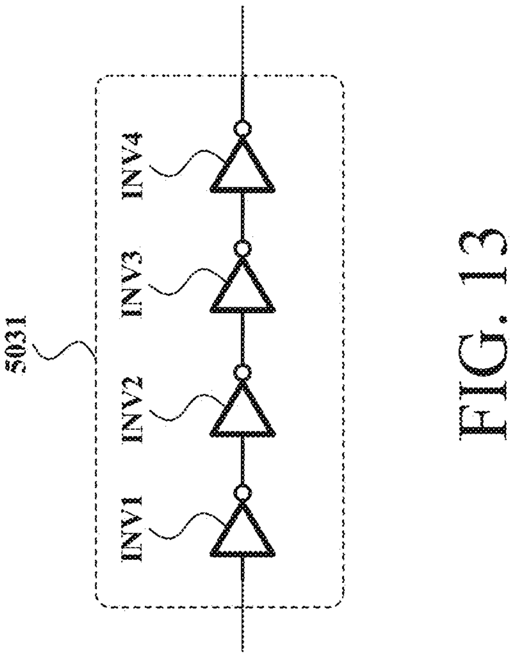
FIG. 13 is a schematic diagram of a delay circuit provided by an example of the present application.

Here and below, the first delay circuit 5030, the second delay circuit 5032, and the third delay circuit 5034 may have the same or similar circuit structure, in some examples, referring to FIG. 13, may be composed of four NOT gates INV1, INV2, INV3 and INV4 connected in series.

Figure 5:
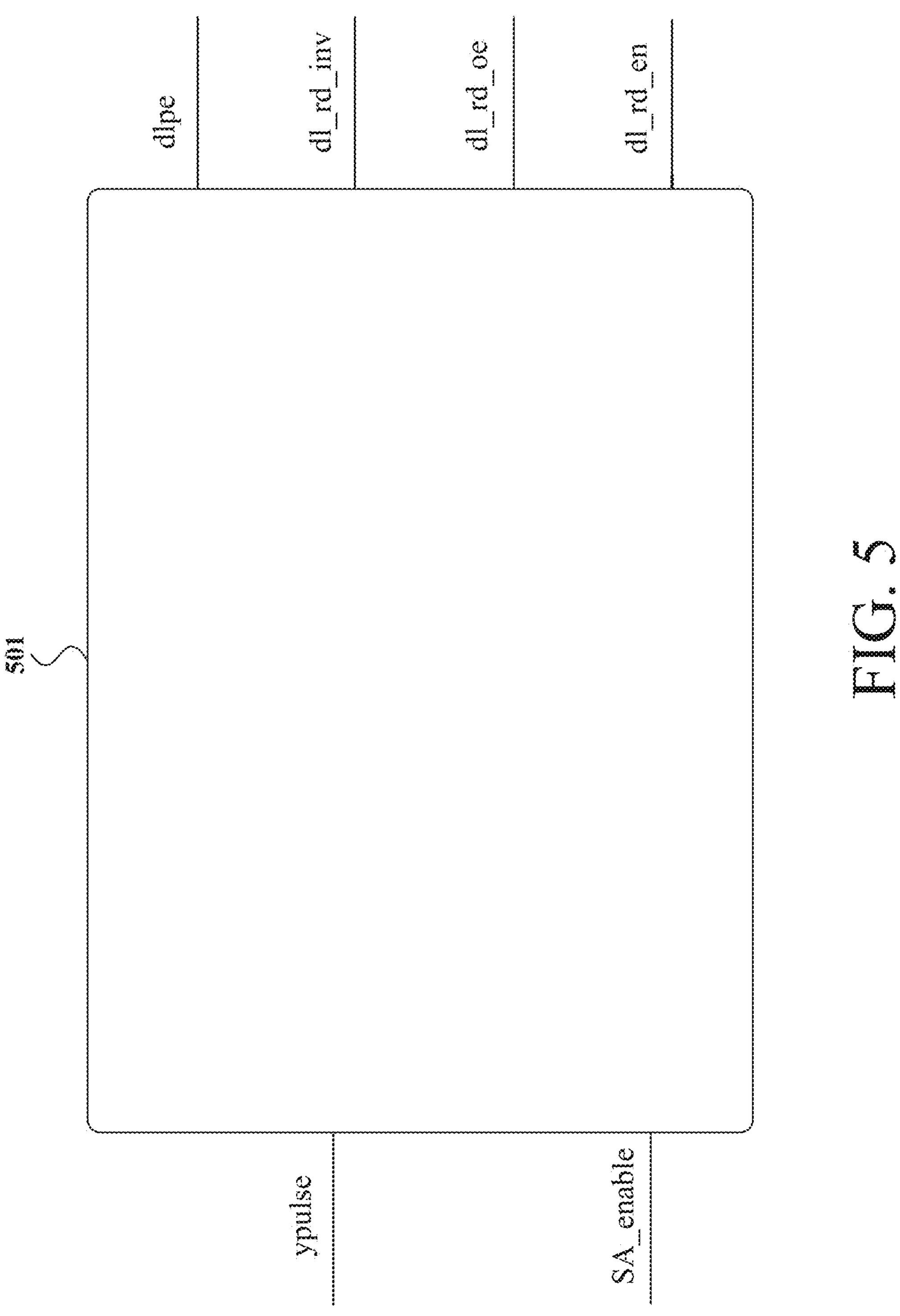
FIG. 5 is a schematic diagram of a control circuit of a second sensing circuit provided by an example of the present application.
Figure 14:
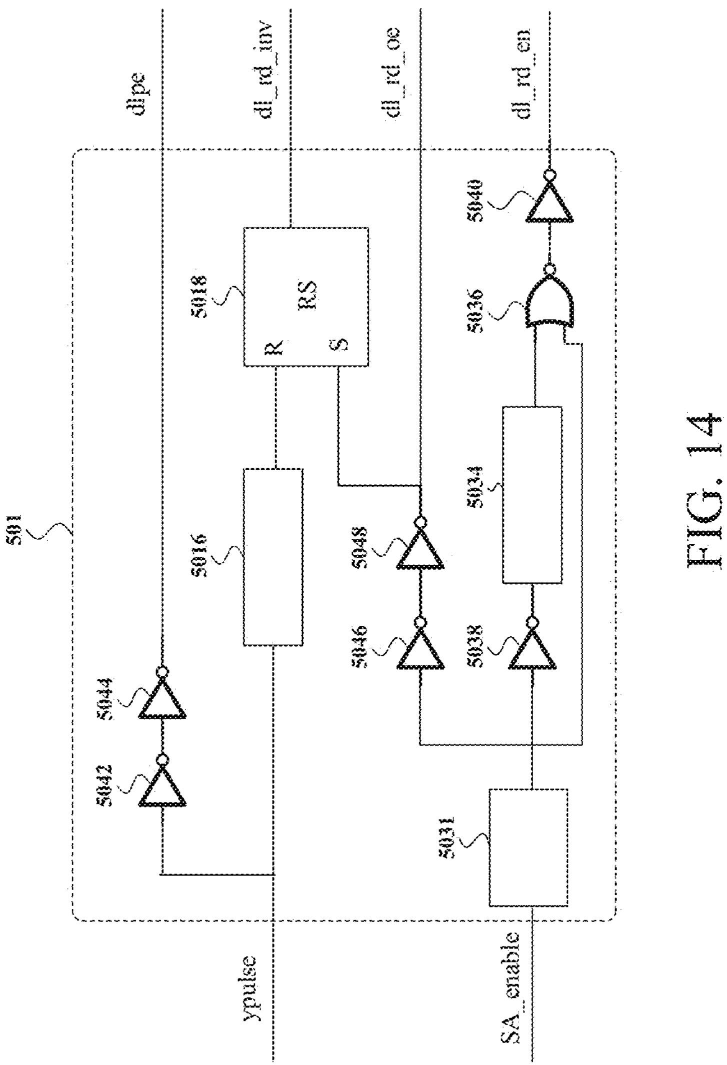
FIG. 14 is a schematic diagram of another example circuit arrangement of the control circuit of FIG. 5.

FIG. 14 is a schematic diagram of another example circuit arrangement of the control circuit of FIG. 5, and the control circuit shown in FIG. 5 may be configured as the control circuit shown in FIG. 14.

The fourth delay circuit 5031 shown in FIG. 14 may have the same or similar circuit structure as the first delay circuit 5030, the second delay circuit 5032, or the third delay circuit 5034. It should be noted that the difference between the control circuit shown in FIG. 3 and the control circuit shown in FIG. 14 is that the isolation signal generating circuit is different. The first pre-charge signal generating circuit, the second sensing enable signal generating circuit and the second pre-charging signal generating circuit shown in FIG. 3 may refer to the first pre-charge signal generating circuit, the second sensing enable signal generating circuit and the second pre-charge signal generating circuit in FIG. 14, respectively.

Figure 15:
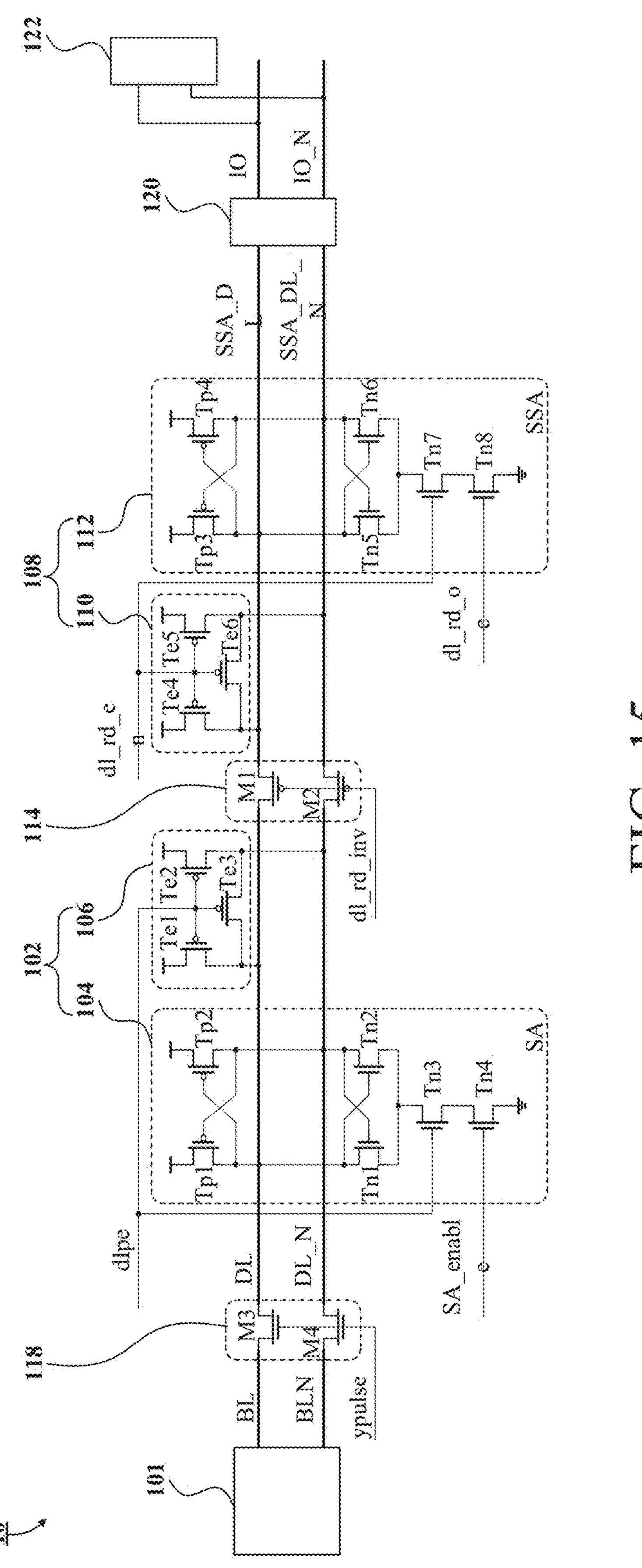
FIG. 15 is a schematic diagram of another example circuit arrangement of the memory device of FIG. 1.

FIG. 15 is a schematic diagram of another example circuit arrangement of the memory device of FIG. 1. Referring to FIG. 1 or FIG. 15, in some examples, the first pair of data lines DL/DL_N includes a first sensing output line DL and a first complementary sensing output line DL_N; the second pair of data lines SSA_DL/SSA_DL_N includes a second sensing output line SSA_DL and a second complementary sensing output line SSA_DL_N; the first sense amplifier 104 and the first pre-charge circuit 106 are both coupled between the first sensing output line DL and the first complementary sensing output line DL_N; the second sense amplifier 112 and the second pre-charge circuit 110 are both coupled between the second sensing output line SSA_DL and the second complementary sensing output line SSA_DL_N.

Referring to FIG. 1 or FIG. 15, in some examples, the isolation circuit 114 includes a first transistor M1 coupled between the first sensing output line DL and the second sensing output line SSA_DL, and a second transistor M2 coupled between the first complementary sensing output line DL_N and the second complementary sensing output line SSA_DL_N; the gate of the first transistor M1 and the gate of the second transistor M2 are both connected and receive the isolation signal dl_rd_inv.

In some examples, the first transistor M1 and the second transistor M2 are PMOS transistors, the isolation signal dl_rd_inv is in a logic low state, and the first transistor M1 and the second transistor M2 are both turned on; the isolation signal dl_rd_inv is in a logic high level state, and both the first transistor M1 and the second transistor M2 are turned off.

Referring to FIG. 15, in some examples, the first pre-charge circuit 106 includes multiple PMOS transistors Te1, Te2, Te3 coupled between the first sensing output line DL and the second sensing output line SSA_DL, the gates of the multiple PMOS transistors Te1, Te2, and Te3 are all connected and receive the first pre-charge signal dlpe; the first sense amplifier 104 includes a first PMOS transistor Tp1, a second PMOS transistor Tp2, a first NMOS transistor Tn1, a second NMOS transistor Tn2, a third NMOS transistor Tn3 and a fourth NMOS transistor Tn4 connected in a cross-coupled manner; the gate of the third NMOS transistor Tn3 receives the first pre-charge signal dlpe, and the drain of the third NMOS transistor Tn3 is connected to the sources of the first NMOS transistor Tn1 and the second NMOS transistor Tn2, the source of the third NMOS transistor Tn3 is connected to the drain of the fourth NMOS transistor Tn4; the gate of the fourth NMOS transistor Tn4 receives the first sensing enable signal SA_enable, and the source of the fourth NMOS transistor Tn4 is connected to the ground reference voltage; the source terminals of the first PMOS transistor Tp1 and the second PMOS transistor Tp2 are connected to the power supply voltage; wherein, the source of the first PMOS transistor Tp1 and the drain of the first NMOS transistor Tn1 are coupled to the first sensing output line DL, and the source of the second PMOS transistor Tp2 and the drain of the second NMOS transistor Tn2 are coupled to the first complementary sensing output line DL_N.

In some examples, in a pre-charging phase followed by the first sensing phase, the first pre-charge signal dlpe is in a logic low state, and the third NMOS transistor Tn3 is in an open circuit state, the source terminals of the first NMOS transistor Tn1 and the second NMOS transistor Tn2 connected in a cross-coupled manner are disconnected from the ground reference voltage, so that the first sense amplifier 104 is in a non-enabled state, and meanwhile, the first pre-charge circuit 106 is in the enabled state and charges the first pair of data lines DL/DL_N to the pre-charge voltage.

In some examples, in the first sensing phase, the first pre-charge signal dlpe and the first sensing enable signal SA_enable are both in a logic high level state, and the third NMOS transistor Tn3 and the fourth NMOS transistor Tn4 are in a conductive state, the sources of the first PMOS transistor Tp1 and the second PMOS transistor Tp2 connected in a cross-coupled manner receive the power voltage signal, and the sources of the first NMOS transistor Tn1 and the second NMOS transistor Tn2 receive the ground reference voltage signal, so that the first sense amplifier 104 is in the enabled state to amplify the data signal received by the first pair of data lines DL/DL_N to the first sensing signal, and meanwhile, the first pre-charge circuit 106 is in the non-enabled state.

Referring to FIG. 15, in some examples, the second pre-charge circuit 110 includes multiple PMOS transistors Te4, Te5, Te6 coupled between the first complementary sensing output line DL_N and the second complementary sensing output line SSA_DL_N, the gates of the multiple PMOS transistors Te4, Te5, and Te6 are all connected and receive the second pre-charge signal dl_rd_en. The second sense amplifier 112 includes a third PMOS transistor Tp3, a fourth PMOS transistor Tp4, a fifth NMOS transistor Tn5, a sixth NMOS transistor Tn6, a seventh NMOS transistor Tn7 and an eighth NMOS transistor Tn8 connected in a cross-coupled manner; the gate of the seventh NMOS transistor Tn7 receives the second pre-charge signal dl_rd_en, the drain of the seventh NMOS transistor Tn7 is connected to the sources of the fifth NMOS transistor Tn5 and the sixth NMOS transistor Tn6, the source of the seventh NMOS transistor Tn7 is connected to the drain of the eighth NMOS transistor Tn8; the gate of the eighth NMOS transistor Tn8 receives the second sensing enable signal dl_rd_oc, the source of the eighth NMOS transistor Tn8 is connected to the ground reference voltage; the source terminals of the third PMOS transistor Tp3 and the fourth PMOS transistor Tp4 are connected to the power supply voltage: wherein, the source of the third PMOS transistor Tp3 and the drain of the fifth NMOS transistor Tn5 are coupled to the second sensing output line SSA_DL, and the source of the fourth PMOS transistor Tp4 and the drain of the sixth NMOS transistor Tn6 are coupled to the second complementary sensing output line SSA_DL_N.

In some examples, in the second sensing phase, the second pre-charge signal dl_rd_en and the second sensing enable signal dl_rd_oe are both in a logic high state, the third NMOS transistor Tn3 and the fourth NMOS transistor Tn4 are in a conductive state, the sources of the first PMOS transistor Tp1 and the second PMOS transistor Tp2 receive the power voltage signal, and the sources of the first NMOS transistor Tn1 and the second NMOS transistor Tn2 receive the ground reference voltage signal, so that the second sense amplifier 112 is in the enabled state to amplify the first sensing signal received by the second pair of data lines SSA_DL/SSA_DL_N to the second sensing signal, and meanwhile, the second pre-charge circuit 110 is in the non-enabled state.

In some examples, in the pre-charging phase following the second sensing phase, the second pre-charge signal dl_rd_en is in a logic low state, and the third NMOS transistor Tn3 is in an open circuit state, the source terminals of the first NMOS transistor Tn1 and the second NMOS transistor Tn2 connected in a cross-coupled manner are disconnected from the ground reference voltage, so that the second sense amplifier 112 is in a non-enabled state, and meanwhile, the second pre-charge circuit 110 is in the enabled state to charge the second pair of data lines SSA_DL/SSA_DL_N to the pre-charge voltage.

Figure 16:
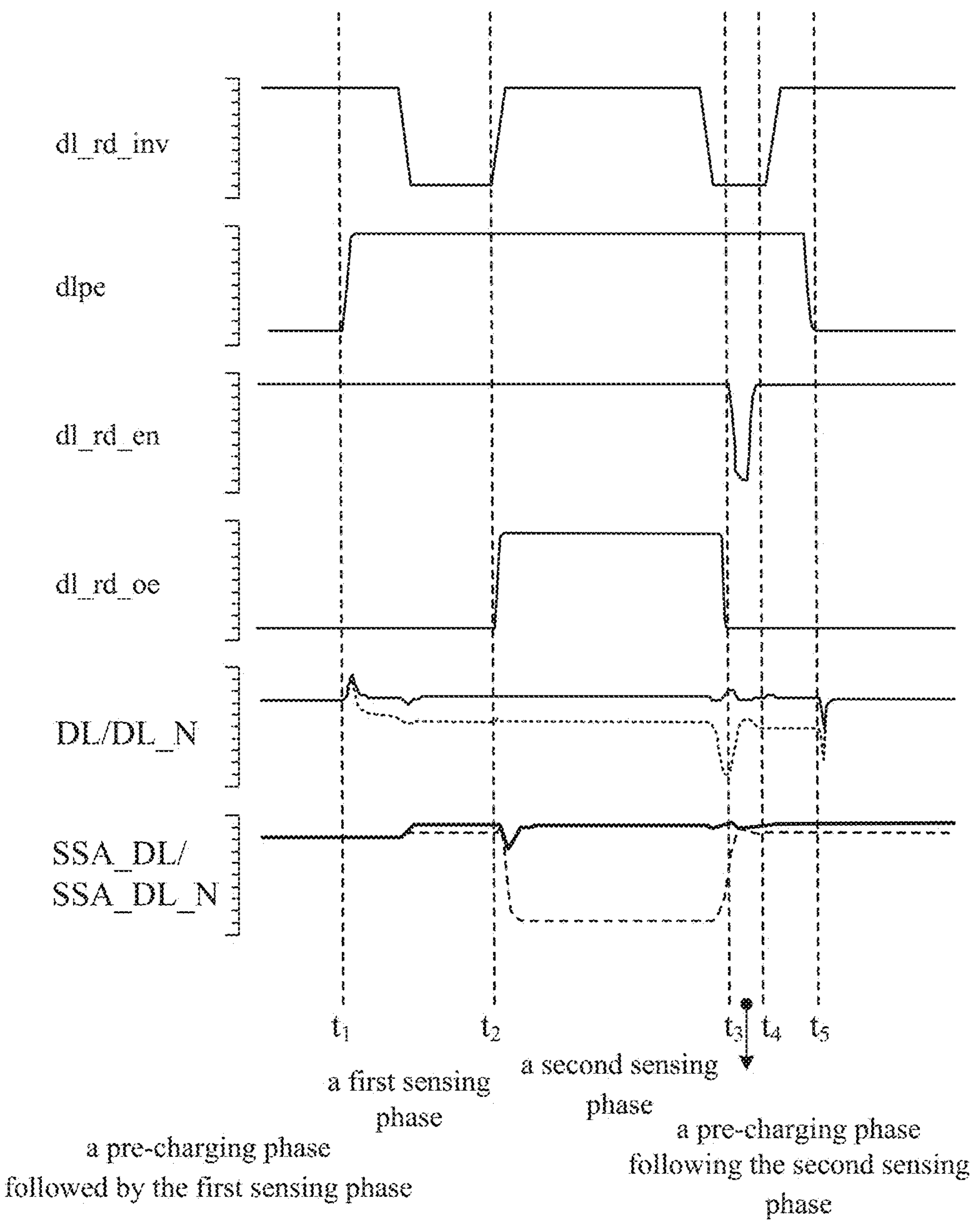
FIG. 16 is a simulation timing diagram of a first control circuit provided by an example of the present application.

FIG. 16 is a simulation timing diagram of a first control circuit (control circuit shown in FIG. 3) provided by an example of the present application. The timing diagram in FIG. 16 may be understood as the timing of the control circuit shown in FIG. 3, in the time interval between time $t_3$ and $t_5$, i.e., in the pre-charging phase following the second sensing phase, due to the timing mismatch of the input signal, the isolation signal dl_rd_inv is still a logic low level, the first pair of data lines DL/DL_N and the second pair of data lines SSA_DL/SSA_DL_N are connected, and the second pre-charge signal dl_rd_en is enabled for the time period (the time interval between time $t_3$ and time $t_4$), which causes both the first pair of data lines DL/DL_N and the second pair of data lines SSA_DL/SSA_DL_N to be pre-charged, it is difficult for the second sensing circuit to pre-charge the second pair of data lines SSA_DL/SSA_DL_N to VDD2H and VDD2H-δ, resulting in an obvious voltage difference in the second pair of data lines SSA_DL/SSA_DL_N in the time interval after time $t_4$, and this may cause unknown timing matching issues.

Figure 17:
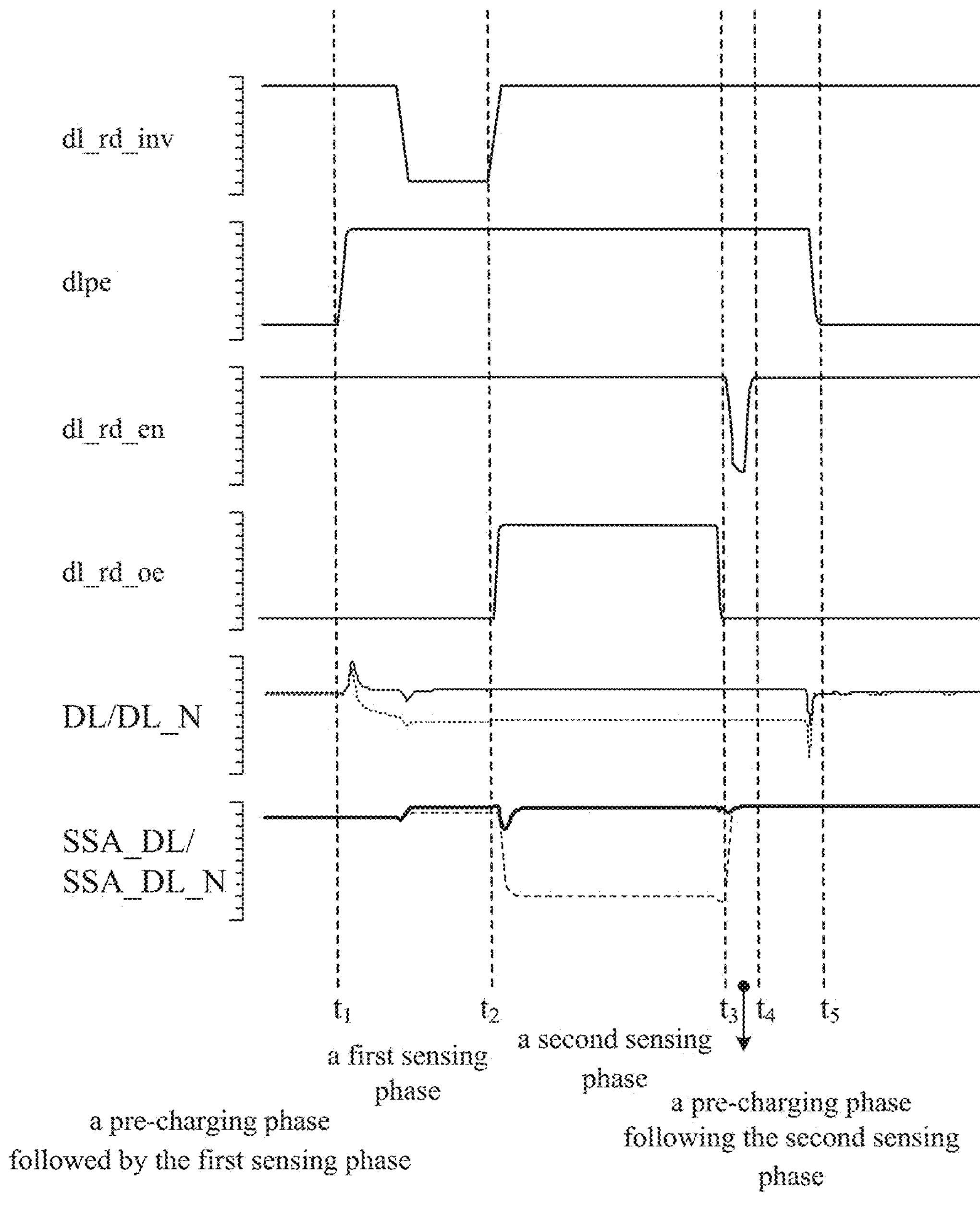
FIG. 17 is a simulation timing diagram of a second control circuit provided by an example of the present application.

FIG. 17 is a simulation timing diagram of a second control circuit (control circuit shown in FIG. 15) provided by an example of the present application. The timing diagram in FIG. 17 may be understood as the timing of the control circuit shown in FIG. 15, only in the time interval between time $t_2$ and $t_3$, that is, in the first sensing phase, the isolation circuit 114 is controlled to connect the first pair of data lines DL/DL_N and the second pair of data lines SSA_DL/SSA_DL_N, in a pre-charging phase followed by the first sensing phase, in the second sensing phase, and in a pre-charging phase following the second sensing phase, the first pair of data lines DL/DL_N is isolated from the second pair of data lines SSA_DL/SSA_DL_N by the isolation circuit 114, in the time interval between time $t_3$ and $t_5$, i.e., in the pre-charging phase following the second sensing phase, the isolation signal dl_rd_inv is a logic high level, the first pair of data lines DL/DL_N and the second pair of data lines SSA_DL/SSA_DL_N are connected, and the second pre-charge signal dl_rd_en is enabled for the time period (the time interval between time $t_3$ and time $t_4$) and only the second pair of data lines SSA_DL/SSA_DL_N is pre-charged, which will not cause both the first pair of data lines DL/DL_N and the second pair of data lines SSA_DL/SSA_DL_N to be pre-charged, the second sensing circuit pre-charges the second pair of data lines SSA_DL/SSA_DL_N to VDD2H and VDD2H-δ. By eliminating the timing mismatch problem caused by the connection of the first pair of data lines DL/DL_N and the second pair of data lines SSA_DL/SSA_DL_N in the pre-charging phase following the second sensing phase, the timing of the control signal of the sense amplifier generated by the control circuit 501 is improved, and the process of operating the sense amplifier is more reasonable.

Referring to FIG. 15, in some examples, the memory device 10 further includes a column decoding circuit 118; the column decoding circuit 118 is coupled between the first pair of data lines DL/DL_N and a pair of bit lines BL/BLN of the array of memory cells and is configured to: receive a column decoding signal and control to connect or disconnect the first pair of sensing output lines DL/DL_N and the pair of bit lines BL/BLN of the array of memory cells.

Here and below, the column decoding signal may be understood as the first pulse signal ypulse in the examples described above.

Referring to FIG. 15, in some examples, column decoding circuit 118 includes a third transistor M3 coupled between bit line BL and first sensing output line DL, and a fourth transistor M4 coupled between the complementary bit line BLN and the first complementary sensing output line DL_N; the gate of the third transistor M3 and the gate of the fourth transistor M4 are both connected and receive the column decoding signal.

In some examples, the third transistor M3 and the fourth transistor M4 are NMOS transistors, the column decoding signal is in a logic high level state/logic low level state, and the third transistor M3 and the fourth transistor M4 are both turned on/off.

Referring to FIG. 15, in some examples, memory device 10 further includes other data control circuits 116, including column select circuit 120; the column select circuit 120 is coupled between the second pair of data lines SSA_DL/SSA_DL_N and the local input/output line pair IO/IO_N, and is configured to receive the column select signal and control the connection or disconnection of the second pair of data lines SSA_DL/SSA_DL_N and the local input/output line pair IO/IO_N.

In some examples, through the column select signal, the second pair of data lines SSA_DL/SSA_DL_N and the local input/output line pair IO/IO_N are connected, and the outside world may read data information from the local input/output line pair IO/IO_N.

Referring to FIG. 15, in some examples, other data control circuits 116 further include: a write driver circuit 122; the write driver circuit 122 is coupled to the local input/output line pair IO/IO_N and is configured to receive the write enable signal and write the external data signal from the local input/output line pair IO/IO_N to the array of memory cells.

In some examples, the memory device of any one of the examples described above includes a Dynamic Random Access Memory.

Figure 18:
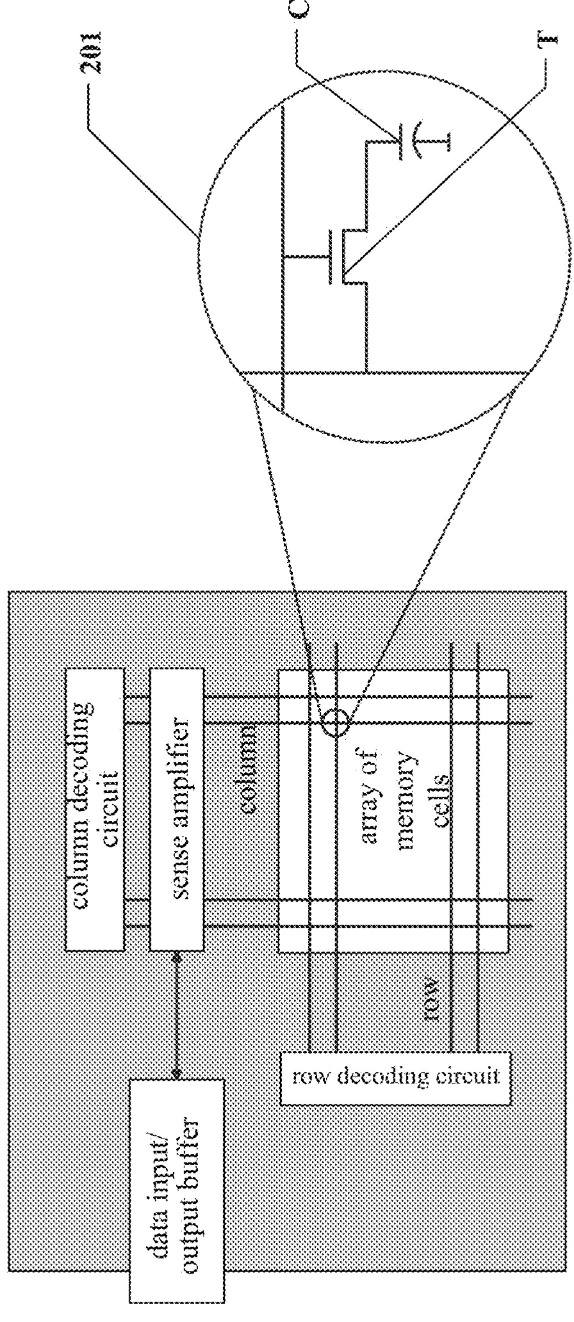
FIG. 18 is a schematic structural diagram of an example dynamic random access memory according to an example of the present application.

FIG. 18 is a schematic structural diagram of an example dynamic random access memory according to an example of the present application. The right side of FIG. 18 shows the circuit of the memory cell in DRAM. DRAM includes at least one DRAM die, each DRAM die includes an array of memory cells, the array of memory cells includes a plurality of memory cells 201 arranged in an array, and each memory cell 201 includes a transistor T and a capacitor C, the main working principle of the memory cell is to represent whether a binary bit is 1 or 0 with the amount of charge stored in the capacitor. The array of memory cells employs a row and a column to specify an address. By specifying an intersection of a row and a column (by specifying a row address and a column address of a DRAM), a memory controller may independently access each memory cell in the DRAM die and perform operations such as read, write or refresh on the data stored in it.

The left side of FIG. 18 shows the array of memory cells and some peripheral circuits in DRAM. It should be noted that, in response to the address input to the row decoding circuit, the row decoding circuit selects the word line to select the row of memory cells to be accessed. The row decoding circuit decodes the input address and enables (activates) the word line corresponding to the decoded address. The column decoding circuit selects one or more bit lines to input our output data into the portion of the row of memory cells that corresponds to the selected word line.

In various examples of the present application, during the process of operating the multi-stage sense amplifier (including the first sensing circuit and the second sensing circuit), by improving the timing of the control signal, in the pre-charging phase after the first and second sensing phases, the isolation circuit is controlled to disconnect the first pair of data lines and the second pair of data lines, thereby eliminating the problem of difficult to pre-charge to the expected intermediate voltage level due to timing mismatch caused by the connection between the first pair of data lines and the second pair of data lines in the pre-charging phase following the second sensing phase, and improving the timing of the control signal of the sense amplifier generated by the control circuit, thus making the process of operating the performance sense amplifier of the memory device more reasonable and stable.

Figure 19:
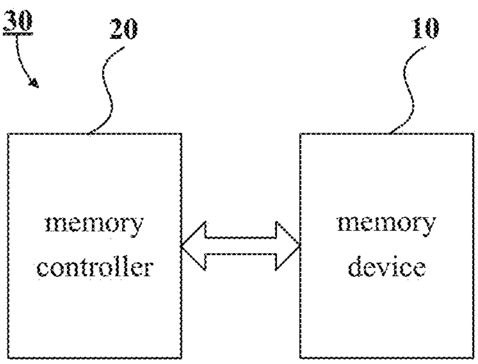
FIG. 19 is a schematic diagram of a memory system provided by an example of the present application.

Referring to FIG. 19, in a second aspect, an example of the present application provides a memory system 30, including: one or more memory devices 10 of any one of the examples of the first aspect; and a memory controller 20 coupled to and controlling the memory device 10.

In some examples, the memory device includes DRAM, SDRAM, or DDR4 SDRAM, SRAM. In some examples, memory controller 20 may control overall operations of memory system 30, e.g., write operation, read operation, and refresh operation. In some examples, memory controller 20 is configured to store data into memory device 10 or to read data stored in memory device 10.

In some examples, memory controller 20 is further configured to store various information required for the operation of the memory system 30 (e.g., metadata information and a mapping table) to the memory device 10, and may access the non-volatile memory device based on information stored in the memory device 10. In a third aspect, an example of the present application provides a method for operating a memory device, the memory device 10, with reference to FIG. 1 or FIG. 15, includes: an array of memory cells 101; a first sensing circuit 102 coupled to the array of memory cells 101 through a first pair of data lines DL/DL_N; a second sensing circuit 108 coupled to the first pair of data lines DL/DL_N through a second pair of data lines SSA_DL/SSA_DL_N; an isolation circuit 114 located between the first pair of data lines DL/DL_N and the second pair of data lines SSA_DL/SSA_DL_N; the operating method includes: in the first sensing phase, controlling the first sensing circuit 102 to amplify a received data signal from the array of memory cells to the first sensing signal, and controlling the isolation circuit 114 to connect the first pair of data lines DL/DL_N and the second pair of data lines SSA_DL/SSA_DL_N to transmit the first sensing signal to the second pair of data lines SSA_DL/SSA_DL_N; in a second sensing phase following the first sensing phase and a pre-charging phase following the second sensing phase, controlling the isolation circuit 114 to disconnect the first pair of data lines DL/DL_N and the second pair of data lines SSA_DL/SSA_DL_N; and in the second sensing phase, controlling the second sensing circuit to amplify the first sensing signal to a second sensing signal, and in the pre-charging phase, controlling the second sensing circuit to charge the second pair of data lines to a pre-charge voltage.

In some examples, the operating method includes: in a pre-charging phase followed by the first sensing phase, controlling the isolation circuit 114 to disconnect the first pair of data lines DL/DL_N and the second pair of data lines SSA_DL/SSA_DL_N, and controlling the first sensing circuit 102 to charge the first pair of data lines DL/DL_N to the pre-charge voltage.

The memory device used in the operating method of the memory device provided by the example of the third aspect of the present application is the same as or similar to the memory device in the example of the third aspect mentioned above, and technical features that are not disclosed in detail in the examples of the present application may be understood with reference to the memory device in each example of the first aspect for understanding, and will not be described again here.

In a fourth aspect, an example of the present application provides a sensing circuit, which referring to FIG. 1 or FIG. 15, includes: a first sensing circuit 102 coupled to an initial pair of data lines through a first pair of data lines DL/DL_N; a second sensing circuit 108 coupled to the first pair of data lines DL/DL_N through a second pair of data lines SSA_DL/SSA_DL_N; an isolation circuit 114 located between the first pair of data lines DL/DL_N and the second pair of data lines SSA_DL/SSA_DL_N; and a control circuit 501 coupled to the first sensing circuit 102, the second sensing circuit 108 and the isolation circuit 114, and configured to: in the first sensing phase, control the first sensing circuit 102 to amplify the data signal on the initial pair of data lines to a first sensing signal on the first pair of data lines DL/DL_N, and control the isolation circuit 114 to connect the first pair of data lines DL/DL_N and the second pair of data lines SSA_DL/SSA_DL_N to transmit the first sensing signal to the second pair of data lines SSA_DL/SSA_DL_N; in a second sensing phase following the first sensing phase and in a pre-charging phase following the second sensing phase, control the isolation circuit 114 to disconnect the first pair of data lines DL/DL_N and the second pair of data lines SSA_DL/SSA_DL_N, and in the second sensing phase, control the second sensing circuit to amplify the first sensing signal transmitted to the second pair of data lines SSA_DL/SSA_DL_N to a second sensing signal, and in the pre-charging phase, control the second sensing circuit 108 to charge the second sensing signal on the second pair of data lines SSA_DL/SSA_DL_N to a pre-charge voltage.

In some examples, the sensing circuit may be used in memory devices including DRAM, SDRAM, or DDR4 SDRAM, SRAM.

In view of this, examples of the present application provide a memory device and operating method thereof, a memory system, and a sensing circuit.

In a first aspect, an example of the present application provides a memory device including: an array of memory cells; a first sensing circuit coupled to the array of memory cells through a first pair of data lines, and configured to amplify a received data signal from the array of memory cells to a first sensing signal; a second sensing circuit coupled to the first pair of data lines through a second pair of data lines, and configured to amplify the first sensing signal to a second sensing signal; an isolation circuit located between the first pair of data lines and the second pair of data lines; and a control circuit coupled to each of the first sensing circuit, the second sensing circuit and the isolation circuit, and configured to: in a first sensing phase, control the first sensing circuit to amplify the data signal to the first sensing signal, and control the isolation circuit to connect the first pair of data lines and the second pair of data lines to transmit the first sensing signal to the second pair of data lines; in a second sensing phase following the first sensing phase and in a pre-charging phase following the second sensing phase, control the isolation circuit to disconnect the first pair of data lines and the second pair of data lines, and in the second sensing phase, control the second sensing circuit to amplify the first sensing signal to a second sensing signal, and in the pre-charging phase, control the second sensing circuit to charge the second pair of data lines to a pre-charge voltage.

In some examples, the control circuit is further configured to: in a pre-charging phase followed by the first sensing phase, control the isolation circuit to disconnect the first pair of data lines and the second pair of data lines, and control the first sensing circuit to charge the first pair of data lines to the pre-charge voltage.

In some examples, the control circuit includes an isolation signal generating circuit configured to: receive a first pulse signal and a first sensing enable signal, and output an isolation signal in accordance with the first pulse signal and the first sensing enable signal; the isolation circuit is configured to receive the isolation signal and connect or disconnect the first pair of data lines and the second pair of data lines based on the isolation signal.

In some examples, the isolation signal generating circuit includes: a pulse elimination circuit configured to, start to output the isolation signal in a first logic state, in response to the first pulse signal being switched to a deactivated state; output the isolation signal switched from the first logic state to a second logic state, in response to the first sensing enable signal being switched to an enabled state; the isolation circuit is configured to connect the first pair of data lines and the second pair of data lines, in response to the isolation signal being in a first logic state, or disconnect the first pair of data lines and the second pair of data lines, in response to the isolation signal being in a second logic state.

In some examples, the pulse elimination circuit includes: a pulse generating circuit and an RS latch; an input terminal of the pulse generating circuit receives the first pulse signal, and an output terminal of the pulse generating circuit outputs a second pulse signal; when the first pulse signal is switched to a deactivated state, the second pulse signal is in the second logic state; a reset terminal of the RS latch receives the second pulse signal, a set terminal receives a delay signal corresponding to the first sensing enable signal, and an output terminal of the RS latch outputs the isolation signal.

In some examples, the control circuit further includes: a first pre-charge signal generating circuit, a second pre-charge signal generating circuit, and a second sensing enable signal generating circuit; the first pre-charge signal generating circuit is configured to generate a first pre-charge signal in accordance with the first pulse signal; the second pre-charge signal generating circuit is configured to generate a second pre-charge signal in accordance with the first sensing enable signal; the second sensing enable signal generating circuit is configured to generate a second sensing enable signal in accordance with the first sensing enable signal; the first sensing circuit includes: a first sense amplifier and a first pre-charge circuit; the second sensing circuit includes: a second sense amplifier and a second pre-charge circuit; in a pre-charging phase followed by the first sensing phase, the first pre-charge circuit is configured to: receive the first pre-charge signal, and in response to the first pre-charge signal being in an activated state, charge the first pair of data lines to the pre-charge voltage; in the first sensing phase, the first sense amplifier is configured to amplify the data signal to the first sensing signal after the charge of the first pair of data lines is completed; in the second sensing phase, the second sense amplifier is configured to receive the second sensing enable signal, and amplify the first sensing signal to the second sensing signal, in response to the second sensing enable signal being in an enabled state; in a pre-charging phase following the second sensing phase, the second pre-charge circuit is configured to charge the second pair of data lines to the pre-charge voltage, in response to the second pre-charge signal being in an activated state.

In some examples, the first pre-charge signal generating circuit includes: two first inverters connected in series; the input terminal of the two inverters connected in series receives the first pulse signal, and the output terminal of the two inverters connected in series outputs the first pre-charge signal; the second sensing enable signal generating circuit includes: a first delay circuit and two second inverters connected in series; the input terminal of the first delay circuit receives the first sensing enable signal, and the output terminal of the first delay circuit is connected to the input terminal of the two second inverters connected in series, the output terminal of the two second inverters connected in series outputs the second sensing enable signal; the second pre-charge signal generating circuit includes: a second delay circuit, a third delay circuit, a NOR gate, a third inverter and a fourth inverter; the input terminal of the second delay circuit receives the first sensing enable signal, and the output terminal of the second delay circuit is connected to the input terminal of the third inverter, the output terminal of the third inverter is connected to the input terminal of the third delay circuit, and the first input terminal of the NOR gate is connected to the output terminal of the third delay circuit, the second input terminal of the NOR gate is connected to the output terminal of the second delay circuit, the output terminal of the NOR gate is connected to the input terminal of the fourth inverter, and the output terminal of the fourth inverter outputs the second pre-charge signal.

In some examples, the first pair of data lines includes a first sensing output line and a first complementary sensing output line; and the second pair of data lines includes a second sensing output line and a second complementary sensing output line; the first sense amplifier and the first pre-charge circuit are both coupled between the first sensing output line and the first complementary sensing output line; the second sense amplifier and the second pre-charge circuit are both coupled between the second sensing output line and the second complementary sensing output line.

In some examples, the isolation circuit includes a first transistor coupled between the first sensing output line and the second sensing output line, and a second transistor coupled between the first complementary sensing output line and the second complementary sensing output line; the gate of the first transistor and the gate of the second transistor are both connected to and receive the isolation signal.

In some examples, the memory device further includes a column decoding circuit; the column decoding circuit is coupled between the first pair of data lines and a pair of bit lines of the array of memory cells and is configured to: receive a column decoding signal and control to connect or disconnect the first pair of sensing output lines and the pair of bit lines of the array of memory cells.

In some examples, the memory device of any one of the examples described above includes a Dynamic Random Access Memory.

In a second aspect, an example of the present application provides a memory system, including: one or more memory devices of any one of the examples of the first aspect; and a memory controller coupled to and controlling the memory device.

In a third aspect, an example of the present application provides a method for operating a memory device, wherein the memory device includes: an array of memory cells; a first sensing circuit coupled to the array of memory cells through a first pair of data lines; a second sensing circuit coupled to the first pair of data lines through a second pair of data lines; an isolation circuit located between the first pair of data lines and the second pair of data lines; the operating method includes: in the first sensing phase, controlling the first sensing circuit to amplify a received data signal from the array of memory cells to the first sensing signal, and controlling the isolation circuit to connect the first pair of data lines and the second pair of data lines to transmit the first sensing signal to the second pair of data lines; in a second sensing phase following the first sensing phase and in a pre-charging phase following the second sensing phase, controlling the isolation circuit to disconnect the first pair of data lines and the second pair of data lines, and in the second sensing phase, controlling the second sensing circuit to amplify the first sensing signal to a second sensing signal, and in the pre-charging phase, controlling the second sensing circuit to charge the second pair of data lines to a pre-charge voltage.

In some examples, the operating method includes: in a pre-charging phase followed by the first sensing phase, controlling the isolation circuit to disconnect the first pair of data lines and the second pair of data lines, and controlling the first sensing circuit to charge the first pair of data lines to the pre-charge voltage.

In a fourth aspect, an example of the present application provides a sensing circuit, including: a first sensing circuit coupled to an initial pair of data lines through a first pair of data lines; a second sensing circuit coupled to the first pair of data lines through a second pair of data lines; an isolation circuit located between the first pair of data lines and the second pair of data lines; and a control circuit coupled to each of the first sensing circuit, the second sensing circuit and the isolation circuit, and configured to: in the first sensing phase, control the first sensing circuit to amplify the data signal on the initial pair of data lines to a first sensing signal on the first pair of data lines, and control the isolation circuit to connect the first pair of data lines and the second pair of data lines to transmit the first sensing signal to the second pair of data lines; in a second sensing phase following the first sensing phase and in a pre-charging phase following the second sensing phase, control the isolation circuit to disconnect the first pair of data lines and the second pair of data lines, and in the second sensing phase, control the second sensing circuit to amplify the first sensing signal transmitted to the second pair of data lines to a second sensing signal, and in the pre-charging phase, control the second sensing circuit to charge the second sensing signal on the second pair of data lines to a pre-charge voltage.

In various examples of the present application, during the process of operating the sense amplifiers at multiple stages (including the first sensing circuit and the second sensing circuit), by improving the timing of the control signal, in the pre-charging phase following the second sensing phases, the isolation circuit is controlled to disconnect the first pair of data lines and the second pair of data lines, thereby eliminating the problem that it is difficult to pre-charge to the expected intermediate voltage level due to the connection between the first pair of data lines and the second pair of data lines in the pre-charging phase following the second sensing phase, thus making the performance of the memory device more stable.

It should be understood that reference throughout the description to "one example" or "an example" means that a particular feature, structure or characteristic related to the example is included in at least one example of the present application. Thus, appearances of "in one example" or "in an example" in various places throughout the description are not necessarily referring to a same example. Furthermore, these particular features, structures or characteristics may be combined in any appropriate manner in one or more examples. It should be understood that in various examples of the present application, sequence numbers of the processes described above do not mean the execution order, and the execution order of each process should be determined by its function and internal logic, and should not constitute any limitation to implementation process of examples of the present application. The serial numbers of examples of the present application described above are for the purpose of description only, and do not represent the advantages and disadvantages of the examples.

The above is only a preferred example of the present application, and does not limit the patent scope of the present application, and under the inventive concept of the present application, any equivalent structural transformation made by using content of the present application and the accompanying drawings, or direct/indirect application in other related technical fields are included in the patent protection scope of the present application.

What is claimed is:

1. A memory device, including:

an array of memory cells;

a first sensing circuit coupled to the array of memory cells through a first pair of data lines, and configured to amplify a received data signal from the array of memory cells to a first sensing signal;

a second sensing circuit coupled to the first pair of data lines through a second pair of data lines, and configured to amplify the first sensing signal to a second sensing signal;

an isolation circuit located between the first pair of data lines and the second pair of data lines; and a control circuit coupled to each of the first sensing circuit, the second sensing circuit, and the isolation circuit, and configured to:

in a first sensing phase, control the first sensing circuit to amplify the data signal to the first sensing signal, and control the isolation circuit to connect the first pair of data lines and the second pair of data lines to transmit the first sensing signal to the second pair of data lines; and in a second sensing phase following the first sensing phase and in a second pre-charging phase following the second sensing phase, control the isolation circuit to disconnect the first pair of data lines and the second pair of data lines, and, in the second sensing phase, control the second sensing circuit to amplify the first sensing signal to the second sensing signal, and, in the second pre-charging phase, control the second sensing circuit to charge the second pair of data lines to a second pre-charge voltage; and the control circuit further including an isolation signal generating circuit, the isolation signal generating circuit including a pulse elimination circuit configured to:

in response to a first pulse signal being switched to a deactivated state, output an isolation signal in a first logic state; and in response to a first sensing enable signal being switched to an enabled state, output the isolation signal in a second logic state, the isolation signal being switched from the first logic state to the second logic state.

2. The memory device of claim 1, wherein the control circuit is further configured to, in a first pre-charging phase followed by the first sensing phase, control the isolation circuit to disconnect the first pair of data lines and the second pair of data lines, and control the first sensing circuit to charge the first pair of data lines to a first pre-charge voltage.

3. The memory device of claim 2, wherein the isolation signal generating circuit is configured to receive the first pulse signal and the first sensing enable signal; and the isolation circuit is configured to:

receive the isolation signal; and connect or disconnect the first pair of data lines and the second pair of data lines based on the isolation signal.

4. The memory device of claim 3, wherein the isolation circuit is configured to:

connect the first pair of data lines and the second pair of data lines, in response to the isolation signal being in the first logic state; or disconnect the first pair of data lines and the second pair of data lines, in response to the isolation signal being in the second logic state.

5. The memory device of claim 4, wherein the pulse elimination circuit includes:

a pulse generating circuit, wherein an input terminal of the pulse generating circuit receives the first pulse signal, and an output terminal of the pulse generating circuit outputs a second pulse signal, wherein, when the first pulse signal is switched to the deactivated state, the second pulse signal is in the second logic state; and an RS latch, wherein a reset terminal of the RS latch receives the second pulse signal, a set terminal of the RS latch receives a delay signal corresponding to the first sensing enable signal, and an output terminal of the RS latch outputs the isolation signal.

6. The memory device of claim 3, wherein the control circuit further includes:

a first pre-charge signal generating circuit configured to generate a first pre-charge signal in accordance with the first pulse signal;

a second pre-charge signal generating circuit configured to generate a second pre-charge signal in accordance with the first sensing enable signal; and a second sensing enable signal generating circuit configured to generate a second sensing enable signal in accordance with the first sensing enable signal, wherein the first sensing circuit includes a first sense amplifier and a first pre-charge circuit, and the second sensing circuit includes a second sense amplifier and a second pre-charge circuit, configured to:

in the first pre-charging phase followed by the first sensing phase, the first pre-charge circuit is configured to:

receive the first pre-charge signal; and in response to the first pre-charge signal being in an activated state, charge the first pair of data lines to the first pre-charge voltage;

in the first sensing phase, the first sense amplifier is configured to amplify the data signal to the first sensing signal after the charge of the first pair of data lines is completed;

in the second sensing phase, the second sense amplifier is configured to:

receive the second sensing enable signal; and in response to the second sensing enable signal being in the enabled state, amplify the first sensing signal to the second sensing signal; and in the second pre-charging phase following the second sensing phase, the second pre-charge circuit is configured to charge the second pair of data lines to the second pre-charge voltage, in response to the second pre-charge signal being in an activated state.

7. The memory device of claim 6, wherein the first pre-charge signal generating circuit includes two first inverters connected in series, wherein an input terminal of the two first inverters connected in series receives the first pulse signal, and an output terminal of the two first inverters connected in series outputs the first pre-charge signal;

the second sensing enable signal generating circuit includes:

a first delay circuit and two second inverters connected in series, wherein an input terminal of the first delay circuit receives the first sensing enable signal; and an output terminal of the first delay circuit is connected to an input terminal of the two second inverters connected in series, an output terminal of the two second inverters connected in series outputs the second sensing enable signal; and the second pre-charge signal generating circuit includes:

a second delay circuit, a third delay circuit, a NOR gate, a third inverter, and a fourth inverter, wherein an input terminal of the second delay circuit receives the first sensing enable signal, and an output terminal of the second delay circuit is connected to an input terminal of the third inverter, an output terminal of the third inverter is connected to an input terminal of the third delay circuit; and a first input terminal of the NOR gate is connected to an output terminal of the third delay circuit, a second input terminal of the NOR gate is connected to the output terminal of the second delay circuit, an output terminal of the NOR gate is connected to an input terminal of the fourth inverter, and an output terminal of the fourth inverter outputs the second pre-charge signal.

8. The memory device of claim 6, wherein the first pair of data lines includes a first sensing output line and a first complementary sensing output line, and the second pair of data lines includes a second sensing output line and a second complementary sensing output line;

the first sense amplifier and the first pre-charge circuit are coupled between the first sensing output line and the first complementary sensing output line; and the second sense amplifier and the second pre-charge circuit are coupled between the second sensing output line and the second complementary sensing output line.

9. The memory device of claim 8, wherein the isolation circuit includes a first transistor coupled between the first sensing output line and the second sensing output line, and a second transistor coupled between the first complementary sensing output line and the second complementary sensing output line, and wherein a gate of the first transistor and a gate of the second transistor are both connected to and receive the isolation signal.

10. The memory device of claim 1, wherein the memory device further includes a column decoding circuit coupled between the first pair of data lines and a pair of bit lines of the array of memory cells and configured to:

receive a column decoding signal; and control to connect or disconnect the first pair of sensing output lines and the pair of bit lines of the array of memory cells.

11. The memory device of claim 1, wherein the memory device includes a Dynamic Random Access Memory.

12. A method for operating a memory device, wherein the memory device includes an array of memory cells, a first sensing circuit coupled to the array of memory cells through a first pair of data lines, a second sensing circuit coupled to the first pair of data lines through a second pair of data lines, an isolation circuit located between the first pair of data lines and the second pair of data lines, and an isolation signal generating circuit connected with the first sensing circuit, the second sensing circuit, and the isolation circuit and including a pulse elimination circuit, the method including:

in a first sensing phase, controlling the first sensing circuit to amplify a received data signal from the array of memory cells to a first sensing signal, and controlling the isolation circuit to connect the first pair of data lines and the second pair of data lines to transmit the first sensing signal to the second pair of data lines;

in a second sensing phase following the first sensing phase and in a second pre-charging phase following the second sensing phase, controlling the isolation circuit to disconnect the first pair of data lines and the second pair of data lines, and, in the second sensing phase, controlling the second sensing circuit to amplify the first sensing signal to a second sensing signal, and, in the second pre-charging phase, controlling the second sensing circuit to charge the second pair of data lines to a pre-charge voltage;

in response to a first pulse signal being switched to a deactivated state, controlling the pulse elimination circuit to output an isolation signal in a first logic state; and in response to a first sensing enable signal being switched to an enabled state, controlling the pulse elimination circuit to output the isolation signal in a second logic state, the isolation signal being switched from the first logic state to the second logic state.

13. The method of claim 12, further includes, in a first pre-charging phase followed by the first sensing phase, controlling the isolation circuit to disconnect the first pair of data lines and the second pair of data lines, and controlling the first sensing circuit to charge the first pair of data lines to a first pre-charge voltage.

14. A sensing circuit, including:

a first sensing circuit coupled to an initial pair of data lines through a first pair of data lines;

a second sensing circuit coupled to the first pair of data lines through a second pair of data lines;

an isolation circuit located between the first pair of data lines and the second pair of data lines; and a control circuit coupled to each of the first sensing circuit, the second sensing circuit, and the isolation circuit, and configured to:

in a first sensing phase, control the first sensing circuit to amplify a data signal on the initial pair of data lines to a first sensing signal on the first pair of data lines, and control the isolation circuit to connect the first pair of data lines and the second pair of data lines to transmit the first sensing signal to the second pair of data lines; and in a second sensing phase following the first sensing phase and in a second pre-charging phase following the second sensing phase, control the isolation circuit to disconnect the first pair of data lines and the second pair of data lines, and, in the second sensing phase, control the second sensing circuit to amplify the first sensing signal transmitted to the second pair of data lines to a second sensing signal, and, in the second pre-charging phase, control the second sensing circuit to charge the second sensing signal on the second pair of data lines to a second pre-charge voltage; and the control circuit further including an isolation signal generating circuit, the isolation signal generating circuit including a pulse elimination circuit configured to:

in response to a first pulse signal being switched to a deactivated state, output an isolation signal in a first logic state; and in response to a first sensing enable signal being switched to an enabled state, output the isolation signal in a second logic state, the isolation signal being switched from the first logic state to the second logic state.

15. The sensing circuit of claim 14, wherein the control circuit is further configured to, in a first pre-charging phase followed by the first sensing phase, control the isolation circuit to disconnect the first pair of data lines and the second pair of data lines, and control the first sensing circuit to charge the first pair of data lines to a first pre-charge voltage.

16. The sensing circuit of claim 15, wherein the isolation signal generating circuit configured to receive the first pulse signal and the first sensing enable signal; and the isolation circuit is configured to:

receive the isolation signal; and connect or disconnect the first pair of data lines and the second pair of data lines based on the isolation signal.

17. The sensing circuit of claim 16, wherein the isolation circuit is configured to:

connect the first pair of data lines and the second pair of data lines, in response to the isolation signal being in the first logic state; or disconnect the first pair of data lines and the second pair of data lines, in response to the isolation signal being in the second logic state.

18. The sensing circuit of claim 17, wherein the pulse elimination circuit includes:

a pulse generating circuit, wherein an input terminal of the pulse generating circuit receives the first pulse signal, and an output terminal of the pulse generating circuit outputs a second pulse signal, wherein, when the first pulse signal is switched to the deactivated state, the second pulse signal is in the second logic state; and an RS latch, wherein a reset terminal of the RS latch receives the second pulse signal, a set terminal of the RS latch receives a delay signal corresponding to the first sensing enable signal, and an output terminal of the RS latch outputs the isolation signal.

19. The sensing circuit of claim 16, wherein the control circuit further includes:

a first pre-charge signal generating circuit configured to generate a first pre-charge signal in accordance with the first pulse signal;

a second pre-charge signal generating circuit configured to generate a second pre-charge signal in accordance with the first sensing enable signal;

a second sensing enable signal generating circuit configured to generate a second sensing enable signal in accordance with the first sensing enable signal, wherein the first sensing circuit includes a first sense amplifier and a first pre-charge circuit, and the second sensing circuit includes a second sense amplifier and a second pre-charge circuit, configured to:

in the first pre-charging phase followed by the first sensing phase, the first pre-charge circuit is configured to:

receive the first pre-charge signal; and in response to the first pre-charge signal being in an activated state, charge the first pair of data lines to the first pre-charge voltage;

in the first sensing phase, the first sense amplifier is configured to amplify the data signal to the first sensing signal after the charge of the first pair of data lines is completed;

in the second sensing phase, the second sense amplifier is configured to;

receive the second sensing enable signal; and
in response to the second sensing enable signal being in the enabled state, amplify the first sensing signal to the second sensing signal; and
in the second pre-charging phase following the second sensing phase, the second pre-charge circuit is configured to charge the second pair of data lines to the second pre-charge voltage, in response to the second pre-charge signal being in an activated state.

20. The sensing circuit of claim 19, wherein the first pre-charge signal generating circuit includes two first inverters connected in series, wherein an input terminal of the two first inverters connected in series receives the first pulse signal, and an output terminal of the two first inverters connected in series outputs the first pre-charge signal;
the second sensing enable signal generating circuit includes:
a first delay circuit and two second inverters connected in series, wherein an input terminal of the first delay circuit receives the first sensing enable signal; and
an output terminal of the first delay circuit is connected to an input terminal of the two second inverters connected in series, an output terminal of the two second inverters connected in series outputs the second sensing enable signal; and
the second pre-charge signal generating circuit includes:
a second delay circuit, a third delay circuit, a NOR gate, a third inverter, and a fourth inverter, wherein an input terminal of the second delay circuit receives the first sensing enable signal, and an output terminal of the second delay circuit is connected to an input terminal of the third inverter, an output terminal of the third inverter is connected to an input terminal of the third delay circuit; and
a first input terminal of the NOR gate is connected to an output terminal of the third delay circuit, a second input terminal of the NOR gate is connected to the output terminal of the second delay circuit, an output terminal of the NOR gate is connected to an input terminal of the fourth inverter, and an output terminal of the fourth inverter outputs the second pre-charge signal.

* * * * *